(12) United States Patent
Yoo et al.

(10) Patent No.: US 12,063,806 B2
(45) Date of Patent: *Aug. 13, 2024

(54) DISPLAY DEVICE AND METHOD FOR MANUFACTURING THE SAME

(71) Applicant: Samsung Display Co., Ltd., Yongin-si (KR)

(72) Inventors: Haram Yoo, Yongin-si (KR); Sangyeol Kim, Hwaseong-si (KR); Sokwon Noh, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/479,938

(22) Filed: Sep. 20, 2021

(65) Prior Publication Data

US 2022/0006039 A1  Jan. 6, 2022

Related U.S. Application Data

(63) Continuation of application No. 16/821,802, filed on Mar. 17, 2020, now Pat. No. 11,171,308.

(30) Foreign Application Priority Data

May 30, 2019 (KR) ......................... 10-2019-0063794

(51) Int. Cl.
*H10K 50/842* (2023.01)
*H10K 50/844* (2023.01)
(Continued)

(52) U.S. Cl.
CPC ....... *H10K 50/8428* (2023.02); *H10K 50/844* (2023.02); *H10K 50/86* (2023.02);
(Continued)

(58) Field of Classification Search
CPC .. H10K 50/8428; H10K 50/844; H10K 50/86; H10K 59/123; H10K 59/40;
(Continued)

(56) References Cited

U.S. PATENT DOCUMENTS

| | | |
|---|---|---|
| 7,843,125 B2 | 11/2010 | Smith et al. |
| 8,835,205 B2 | 9/2014 | Park |
| 9,632,487 B2 | 4/2017 | Kim et al. |
| 9,893,134 B2 | 2/2018 | You et al. |

(Continued)

FOREIGN PATENT DOCUMENTS

| | | |
|---|---|---|
| CN | 107230691 A | 10/2017 |
| CN | 109801941 A | 5/2019 |

(Continued)

*Primary Examiner* — Kyoung Lee
(74) *Attorney, Agent, or Firm* — Lewis Roca Rothgerber Christie LLP

(57) ABSTRACT

A display device comprising: a display panel including: a first area having a first transmittance; and a second area having a second transmittance higher than the first transmittance; and a first module under the second area, wherein the display panel comprises: a base layer; a circuit layer on the base layer; a first pixel electrode electrically connected to the circuit layer and in the first area; a second pixel electrode electrically connected to the circuit layer and in the second area; a first stack structure on the circuit layer and adjacent to the first pixel electrode; and a second stack structure which is on the circuit layer, is adjacent to the second pixel electrode, and is different from the first stack structure.

19 Claims, 22 Drawing Sheets

(51) Int. Cl.
    *H10K 50/86*     (2023.01)
    *H10K 59/123*     (2023.01)
    *H10K 59/40*     (2023.01)
    *H10K 71/00*     (2023.01)
    *H10K 59/12*     (2023.01)
    *H10K 59/131*     (2023.01)
    *H10K 59/38*     (2023.01)

(52) U.S. Cl.
    CPC ........... *H10K 59/123* (2023.02); *H10K 59/40* (2023.02); *H10K 71/00* (2023.02); *H10K 59/1201* (2023.02); *H10K 59/131* (2023.02); *H10K 59/38* (2023.02)

(58) Field of Classification Search
    CPC .. H10K 71/00; H10K 59/1201; H10K 59/131; H10K 59/38; H10K 59/353; H10K 59/122; H10K 59/12; H10K 50/805; H10K 59/121; H10K 2102/302; H10K 2102/351
    See application file for complete search history.

(56) References Cited

U.S. PATENT DOCUMENTS

| | | | |
|---|---|---|---|
| 10,211,265 | B2 | 2/2019 | Jeon et al. |
| 10,454,067 | B2 | 10/2019 | Seo et al. |
| 11,171,308 | B2 * | 11/2021 | Yoo ........................ H10K 7/100 |
| 2003/0129790 | A1 | 7/2003 | Yamazaki et al. |
| 2014/0225078 | A1 | 8/2014 | Jeung et al. |
| 2014/0292622 | A1 | 10/2014 | Lee |
| 2017/0278909 | A1 | 9/2017 | Jeon et al. |
| 2018/0040676 | A1 * | 2/2018 | Hack ..................... H10K 59/121 |
| 2019/0130822 | A1 | 5/2019 | Jung et al. |
| 2020/0365664 | A1 * | 11/2020 | Jeon ..................... H10K 59/121 |

FOREIGN PATENT DOCUMENTS

| | | |
|---|---|---|
| KR | 10-0930760 B1 | 12/2009 |
| KR | 10-2011-0094460 A | 8/2011 |
| KR | 10-2016-0139115 A | 12/2016 |
| KR | 10-2017-0015632 A | 2/2017 |
| KR | 10-2017-0024182 A | 3/2017 |
| KR | 10-2017-0113066 A | 10/2017 |
| KR | 10-1859105 B1 | 5/2018 |

* cited by examiner

FIG. 5
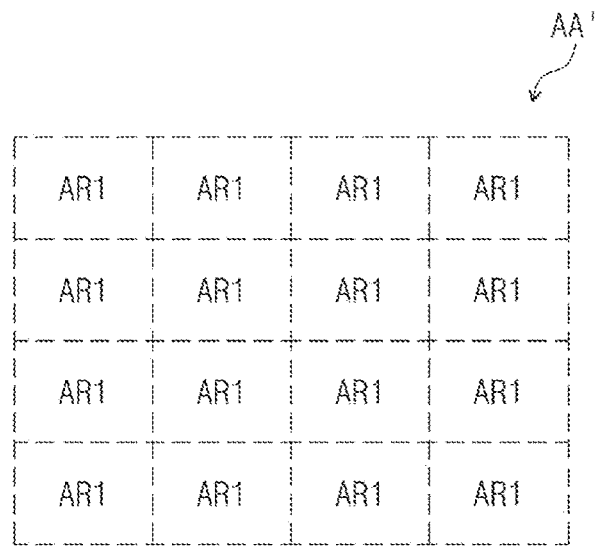
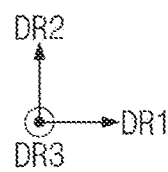
FIG. 6
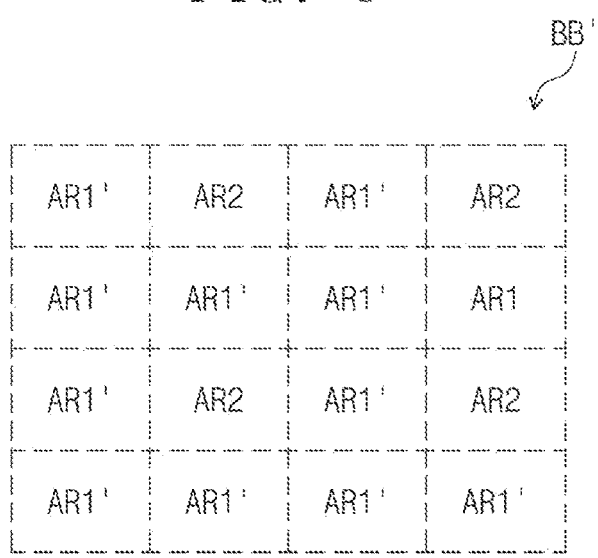
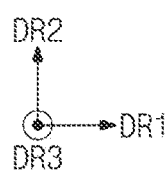

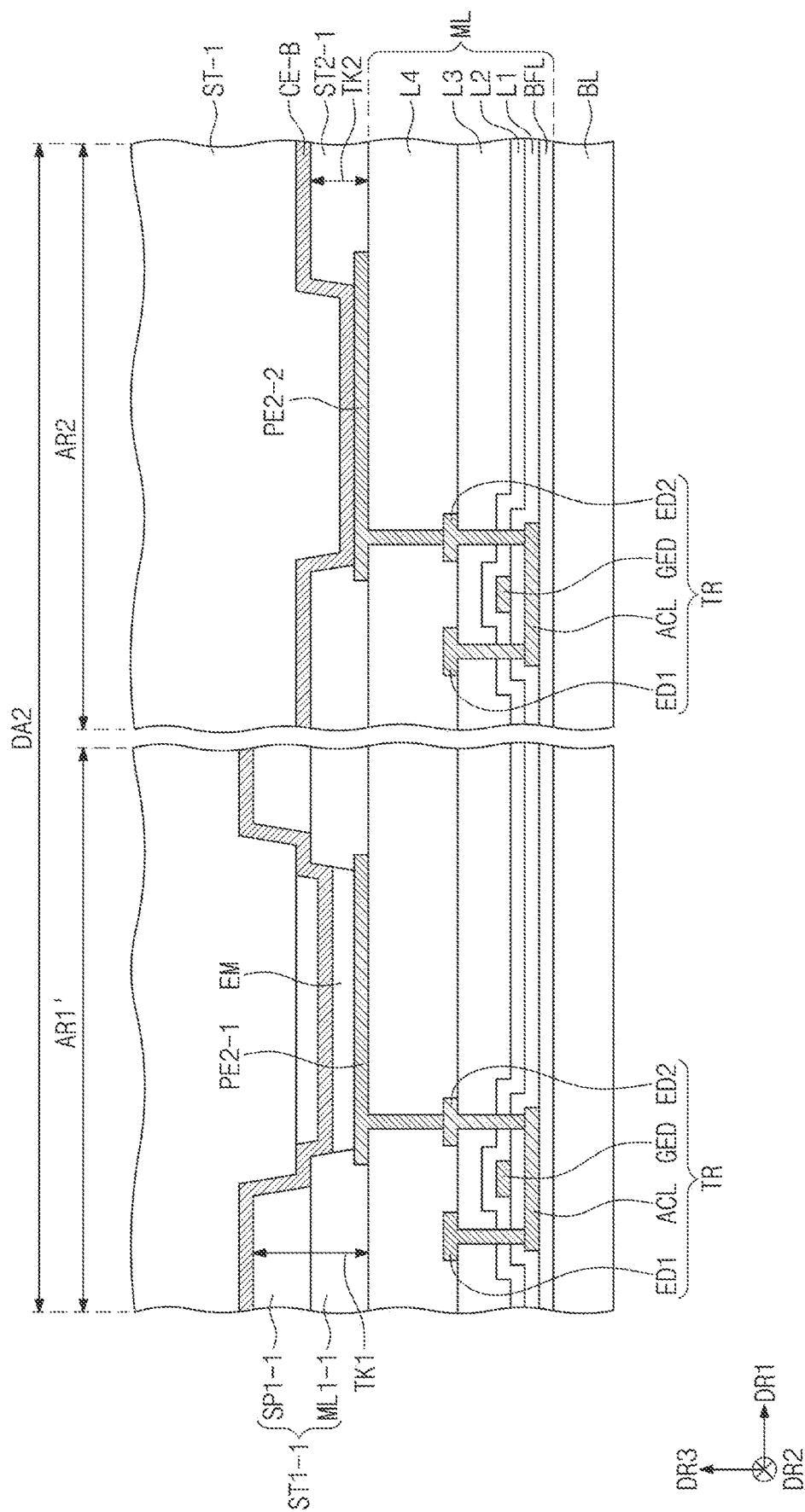

DISPLAY DEVICE AND METHOD FOR MANUFACTURING THE SAME

CROSS-REFERENCE TO RELATED APPLICATIONS

This application is a continuation of U.S. patent application Ser. No. 16/821,802, filed Mar. 17, 2020, which claims priority to and the benefit of Korean Patent Application No. 10-2019-0063794, filed May 30, 2019, the entire content of both of which is incorporated herein by reference.

BACKGROUND

1. Field

Aspects of some example embodiments of the present disclosure herein relates to a display device and a method for manufacturing the same.

2. Description of the Related Art

A display device may include various electronic components such as a display panel for displaying an image, an input sensing member for sensing an external input, and an electronic module. The electronic components may be electrically connected to each other through signal lines variously arranged. The display panel may include a light emitting element for generating an image. The input sensing member may include sensing electrodes for sensing an external input. The electronic module may include a camera, an infrared sensor, and/or a proximity sensor.

The electronic module may be located under the display panel. A hole may be provided in a portion of the display panel, which overlaps with the electronic module. Some components of the display panel may be removed using laser to form the hole. In the laser process, particles may be generated and/or a shape of the display panel may be deformed by heat.

The above information disclosed in this Background section is only for enhancement of understanding of the background and therefore the information discussed in this Background section does not necessarily constitute prior art.

SUMMARY

Aspects of some example embodiments of the present disclosure may provide a display device and a method for manufacturing the same, which are capable of reducing or minimizing a defective rate.

According to some example embodiments of the inventive concepts, a display device may include a display panel including a first area having a first transmittance and a second area having a second transmittance higher than the first transmittance, and a first module under the second area. The display panel may include a base layer, a circuit layer on the base layer, a first pixel electrode electrically connected to the circuit layer and disposed in the first area, a second pixel electrode electrically connected to the circuit layer and disposed in the second area, a first stack structure disposed on the circuit layer and disposed adjacent to the first pixel electrode, and a second stack structure which is disposed on the circuit layer, is adjacent to the second pixel electrode, and is different from the first stack structure.

According to some example embodiments, the first stack structure may include a first intermediate layer disposed on the circuit layer and exposing at least a portion of the first pixel electrode, and a first spacer disposed on the first intermediate layer. An area of the first spacer may be less than an area of the first intermediate layer when viewed in a plan view.

According to some example embodiments, the second stack structure may include a second intermediate layer disposed on the circuit layer and covering the second pixel electrode, and a second spacer disposed on the second intermediate layer.

According to some example embodiments, an area of the second intermediate layer may be equal to an area of the second spacer when viewed in a plan view.

According to some example embodiments, the first intermediate layer and the second intermediate layer may include the same material and may be disposed on the same layer.

According to some example embodiments, a first maximum thickness of the first stack structure may be greater than a second maximum thickness of the second stack structure.

According to some example embodiments, the second stack structure may include a second intermediate layer disposed on the same layer as the first intermediate layer.

According to some example embodiments, the display panel may further include a third area having a third transmittance higher than the second transmittance. In this case, the display device may further include a second module under the third area. The display panel may further include a third pixel electrode electrically connected to the circuit layer and disposed in the third area.

According to some example embodiments, the first intermediate layer and the first spacer may not be disposed in the third area.

According to some example embodiments, the first stack structure may include m layer(s), the second stack structure may include n layer(s), and 'm' may be greater than 'n'.

According to some example embodiments, the display panel may further include a common electrode including a first hole and a second hole.

According to some example embodiments, the first hole and the second hole may be disposed in the second area.

According to some example embodiments, the second area may include a first sub-area providing light and a second sub-area not providing the light. The first hole may be disposed in the first sub-area, and the second hole may be disposed in the second sub-area.

According to some example embodiments, the second pixel electrode may be disposed in the second sub-area.

According to some example embodiments, the display panel may further include a fourth pixel electrode disposed in the first sub-area, and a third stack structure disposed on the circuit layer and disposed adjacent to the fourth pixel electrode. The third stack structure may have the same structure as the first stack structure.

According to some example embodiments, the third stack structure may include an intermediate layer exposing at least a portion of the fourth pixel electrode, and a spacer disposed on the intermediate layer. The first hole may be defined on the spacer.

According to some example embodiments of the inventive concepts, a method for manufacturing a display device may include forming a base layer, forming a circuit layer on the base layer, forming a first pixel electrode and a second pixel electrode on the circuit layer, forming a first stack structure in an area adjacent to the first pixel electrode, forming a second stack structure, which is different from the first stack structure, in an area adjacent to the second pixel electrode, forming a common electrode covering the first stack structure and the second stack structure, and removing a portion of the common electrode, which is disposed on the second stack structure, by using a stamping process.

According to some example embodiments, the method may further include forming a third pixel electrode on the circuit layer, forming a third stack structure, which has the same structure as the first stack structure, in an area adjacent to the third pixel electrode, and removing a portion of the common electrode, which is disposed on the third stack structure, by using the stamping process. The portions of the common electrode disposed on the second and third stack structures may be removed at the same time.

According to some example embodiments, a number of layer(s) constituting the second stack structure may be different from a number of layer(s) constituting the first stack structure.

According to some example embodiments, a shape of a layer constituting the first stack structure may be different from a shape of a layer constituting the second stack structure.

BRIEF DESCRIPTION OF THE DRAWINGS

The accompanying drawings are included to provide a further understanding of the inventive concepts, and are incorporated in and constitute a part of this specification. The drawings illustrate example embodiments of the inventive concepts and, together with the description, serve to explain principles of the inventive concepts. In the drawings:

FIG. 5 is an enlarged plan view of an area AA' of FIG. 4;
FIG. 6 is an enlarged plan view of an area BB' of FIG. 4.

FIGS. 19A and 19B are cross-sectional views illustrating some processes of a method for manufacturing a display device according to some example embodiments of the inventive concepts.

DETAILED DESCRIPTION

Figure 1A:
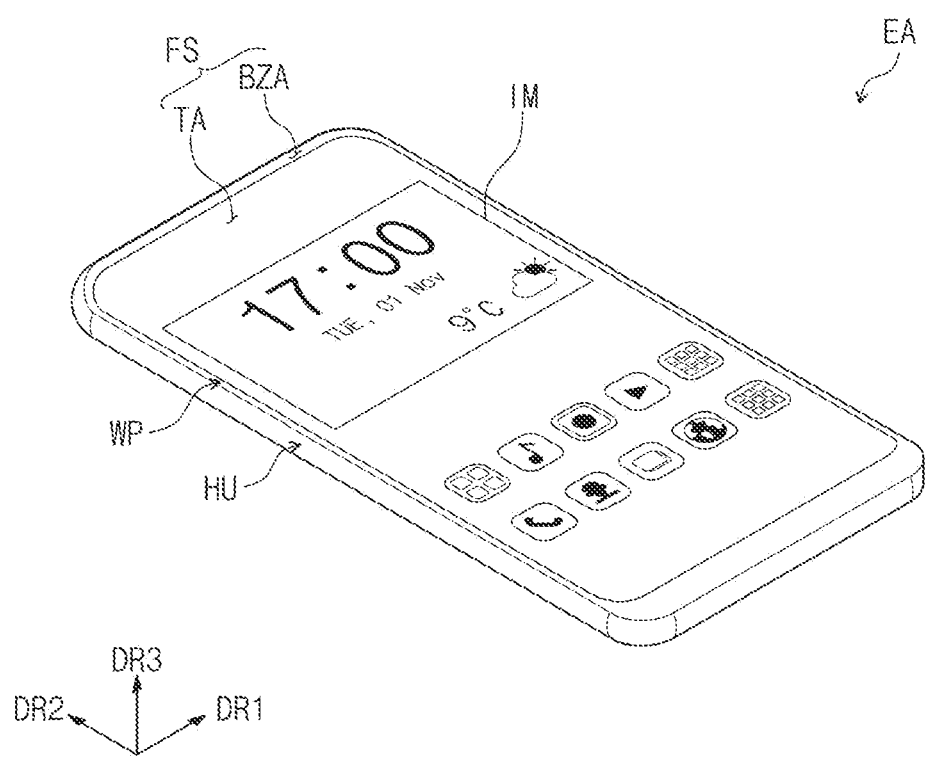
FIG. 1A is a perspective view illustrating a display device according to some example embodiments of the inventive concepts.

Aspects of some example embodiments of the inventive concepts now will be described more fully hereinafter with reference to the accompanying drawings, in which various embodiments are shown. The inventive concepts may, however, be embodied in many different forms, and should not be construed as limited to the embodiments set forth herein. Rather, these embodiments are provided so that this disclosure will be thorough and complete, and will fully convey the scopes of the inventive concepts to those skilled in the art. Like reference numerals refer to like elements throughout.

It will be understood that when an element such as a layer, region or substrate is referred to as being "on" another element, it can be directly on the other element or intervening elements may be present. In contrast, the term "directly" means that there are no intervening elements. As used herein, the term "and/or" includes any and all combinations of one or more of the associated listed items.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Aspects of some example embodiments are described herein with reference to cross-sectional illustrations and/or plane illustrations that are idealized example illustrations. In the drawings, the thicknesses of layers and regions are exaggerated for clarity. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Hereinafter, example embodiments of the inventive concepts will be described in detail with reference to the accompanying drawings.

Figure 1B:
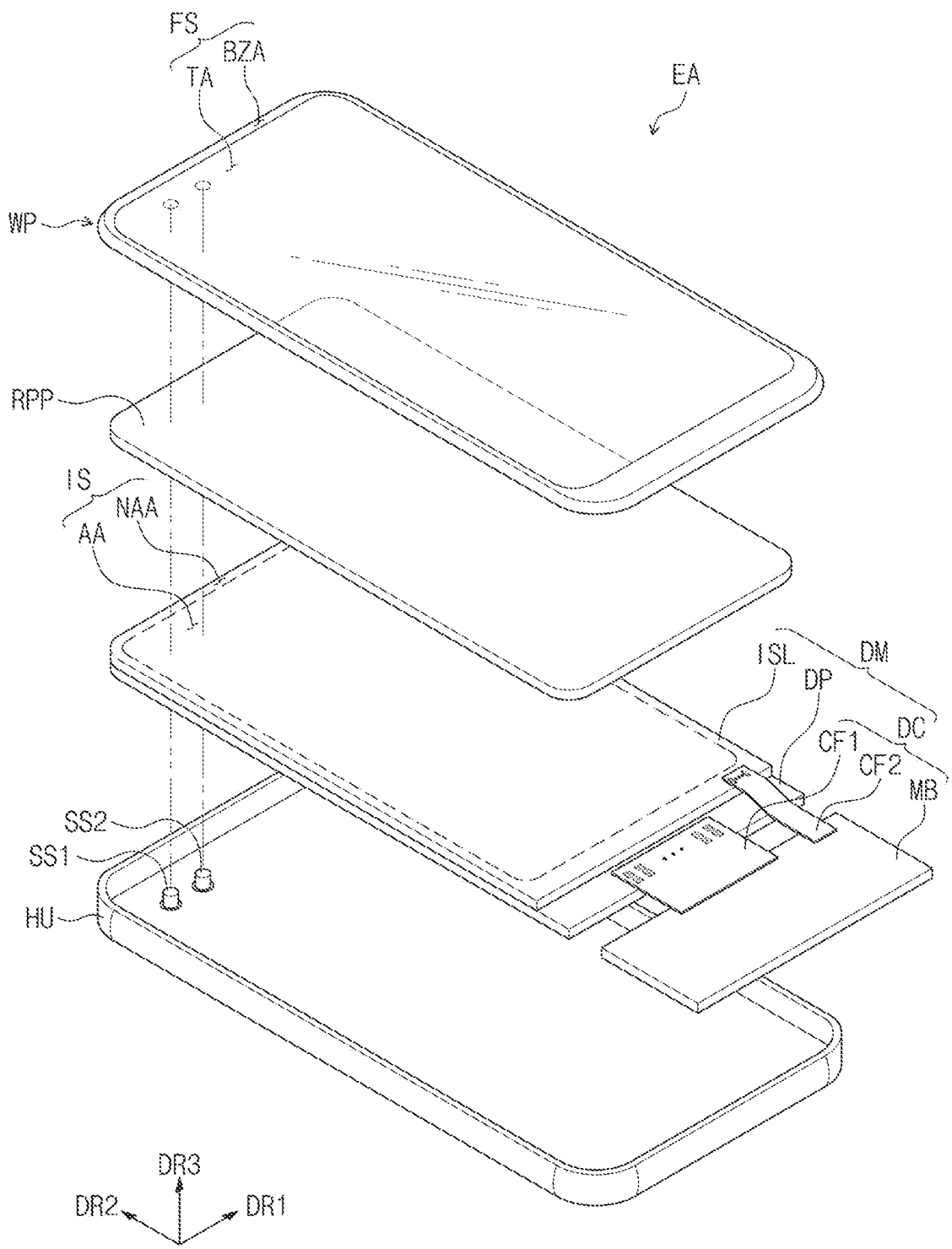
FIG. 1B is an exploded perspective view illustrating a display device according to some example embodiments of the inventive concepts.

FIG. 1A is a perspective view illustrating a display device according to some example embodiments of the inventive concepts. FIG. 1B is an exploded perspective view illustrating a display device according to some example embodiments of the inventive concepts.

Referring to FIGS. 1A and 1B, a display device EA may be activated by an electrical signal. The display device EA may be realized as various embodiments. For example, the display device EA may be used in large-sized electronic devices (e.g., televisions, monitors, and external billboards) and small and middle-sized electronic devices (e.g., personal computers, notebook computers, personal digital assistants (PDAs), car navigation units, game consoles, portable electronic devices, and cameras). However, these are provided only as examples of the inventive concepts, and the display device EA according to the inventive concepts may also be applied to other electronic devices without departing the spirits and scopes of the inventive concepts. According to some example embodiments, a smart phone is illustrated as an example of the display device EA.

The display device EA may display an image IM on a display surface FS parallel to first and second directions DR1 and DR2 in a third direction DR3. The image IM may include a dynamic image and a static image. In FIG. 1A, a time display box and icons are illustrated as an example of the image IM. The display surface FS on which the image IM is displayed may correspond to a front surface of the display device EA and may correspond to a front surface of a window panel WP.

According to some example embodiments, a front surface (or a top surface) and a rear surface (or a bottom surface) of each component may be defined based on a direction (e.g., the third direction DR3) in which the image IM is displayed. The front surface and the rear surface may be opposite to each other in the third direction DR3, and a normal direction of each of the front surface and the rear surface may be parallel to the third direction DR3. However, directions indicated by the first to third directions DR1, DR2 and DR3 may be relative concepts and may be changed into other directions.

According to some example embodiments, the display device EA may sense a user's input applied from the outside. The user's input may include at least one of various external inputs such as a part (e.g., a finger) of a user's body, light, heat, and pressure. In certain embodiments, the display device EA may sense a user's input applied to a side surface or a rear surface of the display device EA in accordance with a structure of the display device EA. However, the inventive concepts are not limited to a specific embodiment.

The display device EA may include a window panel WP, an anti-reflection panel RPP, a display module DM, first and second modules SS1 and SS2, and a housing HU. According to some example embodiments, the window panel WP and the housing HU may be coupled to each other to form the exterior of the display device EA.

The window panel WP may include an optically clear or transparent insulating material. For example, the window panel WP may include glass or plastic. The window panel WP may have a single-layered structure or a multi-layered structure. For example, the window panel WP may include a plurality of plastic films coupled to each other by an adhesive or may include a glass substrate and a plastic film coupled to each other by an adhesive.

As described above, the front surface FS of the window panel WP may define the front surface of the display device EA. The front surface FS may include a transmission area TA and a bezel area BZA.

The transmission area TA may be optically transparent. For example, the transmission area TA may have a visible light transmittance of about 90% or more. A light transmittance of the bezel area BZA may be less than the light transmittance of the transmission area TA. The bezel area BZA may have a predetermined color. The bezel area BZA may define a shape of the transmission area TA. The bezel area BZA may be adjacent to the transmission area TA and may surround the transmission area TA in a plan view. According to some example embodiments, the bezel area BZA may be omitted in the window panel WP.

The anti-reflection panel RPP may be located under the window panel WP. The anti-reflection panel RPP may reduce a reflectance of external light incident through the window panel WP. In certain embodiments, the anti-reflection panel RPP may be omitted or may be embedded in the display module DM.

The display module DM may display the image IM and may sense an external input. The display module DM may include a front surface IS including an active area AA and the peripheral area NAA. The active area AA may be an area that is activated by an electrical signal.

According to some example embodiments, the active area AA may be an area in which the image IM is displayed and may also be an area in which the external input is sensed. The transmission area TA may overlap with at least the active area AA. For example, the transmission area TA may overlap with the whole or at least a portion of the active area AA. Thus, a user may view the image IM through the transmission area TA and/or may provide the external input through the transmission area TA. However, embodiments of the inventive concepts are not limited thereto. According to some example embodiments, an area for displaying the image IM and an area for sensing the external input may be separated from each other in the active area AA.

The peripheral area NAA may be covered by the bezel area BZA. The peripheral area NAA may be adjacent to the active area AA. The peripheral area NAA may surround the active area AA when viewed in a plan view. A driving circuit and/or driving lines for driving the active area AA may be disposed in the peripheral area NAA.

According to some example embodiments, the display module DM may be assembled in a flat state where the active area AA and the peripheral area NAA face the window panel WP. However, embodiments of the inventive concepts are not limited thereto. According to some example embodiments, a portion of the peripheral area NAA of the display module DM may be bent. In this case, a portion of the peripheral area NAA may face a rear surface of the display device EA, and thus the bezel area BZA in the front surface of the display device EA may be reduced. According to some example embodiments, the display module DM may be assembled in a state where a portion of the active area AA is also bent.

The display module DM may include a display panel DP, an input sensing layer ISL, and a driving circuit DC.

The display panel DP may be a component which substantially generates the image IM. The image IM generated from the display panel DP may be visible to a user through the transmission area TA.

The input sensing layer ISL may sense the external input applied from the outside. As described above, the input sensing layer ISL may sense the external input provided to the window panel WP.

The driving circuit DC may be electrically connected to the display panel DP and the input sensing layer ISL. The driving circuit DC may include a main circuit board MB, a first circuit board CF1, and a second circuit board CF2.

The first circuit board CF1 and the second circuit board CF2 may be flexible circuit films. The first circuit board CF1 may provide signals to the display panel DP, and the second circuit board CF2 may provide electrical signals for driving the input sensing layer ISL. Alternatively, according to some example embodiments, the first and second circuit boards CF1 and CF2 may be replaced with a single board. According to some example embodiments, the first and second circuit boards CF1 and CF2 may be omitted, and the main circuit board MB may be connected directly to the display panel DP and the input sensing layer ISL.

The main circuit board MB may include various kinds of driving circuits for driving the display module DM and/or a connector for supplying power. The first circuit board CF1 and the second circuit board CF2 may be connected to the main circuit board MB. According to some example embodiments of the inventive concepts, the display module DM may be easily controlled through one main circuit board MB. However, embodiments of the inventive concepts are not limited thereto. In other embodiments, the display panel DP and the input sensing layer ISL of the display module DM may be connected to different main circuit boards, or one of the first and second circuit boards CF1 and CF2 may not be connected to the main circuit board MB.

The first and second modules SS1 and SS2 may be located under the display module DM. The first and second modules SS1 and SS2 may be located under the display panel DP. The first and second modules SS1 and SS2 may overlap with the active area AA when viewed in a plan view. Thus, a space of the bezel area BZA, in which the first and second modules SS1 and SS2 may be located, may be omitted. As a result, an increase in area (or size) of the bezel area BZA may be prevented.

The first and second modules SS1 and SS2 may receive external inputs transmitted through the transmission area TA and/or may provide output signals through the transmission area TA. Each of the first and second modules SS1 and SS2 may include, but not limited to, an infrared sensor, a proximity sensor, a camera, a speaker, a light sensor, or a heat sensor.

The housing HU may be coupled to the window panel WP. The housing HU and the window panel WP may be coupled to each other to provide a space in which the display module DM and the first and second modules SS1 and SS2 are received.

The housing HU may be formed of a material having relatively high rigidity. For example, the housing HU may include a plurality of frames and/or plates formed of glass, plastic, a metal, or a combination thereof. The housing HU may stably protect the components of the display device EA received in the space from an external impact.

FIGS. 2A to 2D are cross-sectional views illustrating display devices according to some embodiments of the inventive concepts.

FIGS. 2A to 2D illustrate cross sections defined by the first direction DR1 and the third direction DR3. FIGS. 2A to 2D simply illustrate display devices EA to describe stacking relation of functional components of the display devices EA.

A display device EA according to some example embodiments of the inventive concepts may include a display panel, an input sensing sensor, an anti-reflector, and a window. At least some of the display panel, the input sensing sensor, the anti-reflector and the window may be integrally formed with each other by continuous processes or may be coupled to each other by an adhesive member. In FIGS. 2A to 2D, an optically clear adhesive member OCA is illustrated as an example of the adhesive member. The adhesive member described hereinafter may include a general adhesive or glue. In certain embodiments, the anti-reflector and the window may be replaced with other component(s) or may be omitted.

In FIGS. 2A to 2D, at least one of the input sensing sensor, the anti-reflector and the window, which is integrally formed with another component through continuous processes, is represented as "~ layer". At least one of the input sensing sensor, the anti-reflector and the window, which is coupled to another component through the adhesive member, is represented as "~ panel". The "panel" may include a base layer providing a base surface. For example, the base layer may be a synthetic resin film, a composite material film, or a glass substrate. The "layer" may not include the base layer. In other words, the component represented as the "layer" is located on a base surface provided by another component.

Hereinafter, the input sensing sensor, the anti-reflector and the window may be referred to as an input sensing panel ISP, an anti-reflection panel RPP and a window panel WP, or an input sensing layer ISL, an anti-reflection layer RPL and a window layer WL, depending on whether the base layer exists or not.

Figure 2A:
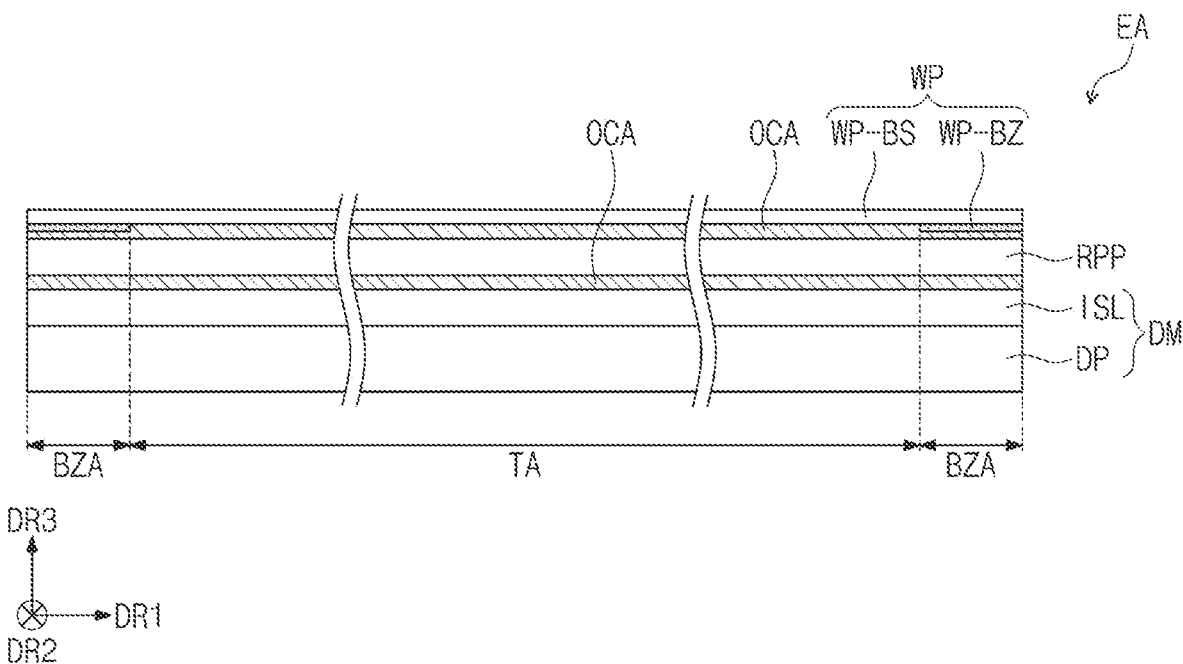
FIGS. 2A to 2D are cross-sectional views illustrating display devices according to some example embodiments of the inventive concepts.

As illustrated in FIG. 2A, the display device EA may include the display panel DP, the input sensing layer ISL, the anti-reflection panel RPP, and the window panel WP. The input sensing layer ISL may be located directly on the display panel DP. In the present specification, it is understood that when a component 'B' is located directly on a component 'A', an additional adhesive layer/adhesive member is not located between the component 'A' and the component 'B'. In other words, the term "directly" means that there are no intervening components. After formation of the component 'A', the component 'B' is formed on a base surface, provided by the component 'A', through continuous processes.

The display panel DP and the input sensing layer ISL located directly on the display panel DP may be defined as a display module DM. The optically clear adhesive members OCA may be located between the display module DM and the anti-reflection panel RPP and between the anti-reflection panel RPP and the window panel WP, respectively.

The display panel DP may generate an image, and the input sensing layer ISL may obtain coordinate information of an external input (e.g., a touch event). The display module DM according to some example embodiments of the inventive concepts may further include a protective member located on a bottom surface of the display panel DP. The protective member and the display panel DP may be coupled to each other through an adhesive member. Each of display devices EA of FIGS. 2B to 2D described below may also further include the protective member.

The display panel DP according to some example embodiments of the inventive concepts may be, but not limited to, a light emitting type display panel. For example, the display panel DP may be an organic light emitting display panel or a quantum-dot light emitting display panel. An emission layer of the organic light emitting display panel may include an organic light emitting material. An emission layer of the quantum-dot light emitting display panel may include quantum dots and/or quantum rods. Hereinafter, the display panel DP which is the organic light emitting display panel will be described as an example.

The anti-reflection panel RPP may reduce a reflectance of external light incident through the window panel WP. The anti-reflection panel RPP according to some example embodiments of the inventive concepts may include a retarder and a polarizer. The retarder may be a film type or a liquid crystal coating type and may include a λ/2 retarder and/or a λ/4 retarder. The polarizer may also be a film type and may include an elongated synthetic resin film. The anti-reflection panel RPP may further include a protective film. The retarder and/or the polarizer may be defined as a base layer of the anti-reflection panel RPP, or the protective film may be defined as the base layer of the anti-reflection panel RPP.

The anti-reflection panel RPP according to some example embodiments of the inventive concepts may include color filters. The color filters may be arranged in a set or predetermined form. The arrangement of the color filters may be determined in consideration of light emitting colors of pixels included in the display panel DP. The anti-reflection panel RPP may further include a black matrix adjacent to the color filters.

The anti-reflection panel RPP according to some example embodiments of the inventive concepts may include a destructive interference structure. For example, the destructive interference structure may include a first reflective layer and a second reflective layer which are located on different layers. First reflected light and second reflected light respectively reflected from the first reflective layer and the second reflective layer may destructively interfere with each other, and thus a reflectance of external light may be reduced.

The window panel WP according to some example embodiments of the inventive concepts may include a base layer WP-BS and a light blocking pattern WP-BZ. The base layer WP-BS may include a glass substrate and/or a synthetic resin film. The base layer WP-BS is not limited to a single layer. The base layer WP-BS may include two or more films coupled to each other by an adhesive member.

The light blocking pattern WP-BZ may partially overlap with the base layer WP-BS. The light blocking pattern WP-BZ may be located on a rear surface of the base layer WP-BS and may substantially define the bezel area BZA of the display device EA. An area in which the light blocking pattern WP-BZ is not located may define the transmission area TA of the display device EA. In the window panel WP, an area in which the light blocking pattern WP-BZ is located may be defined as a light blocking area of the window panel WP, and an area in which the light blocking pattern WP-BZ is not located may be defined as a transmission area of the window panel WP.

Figure 2B:
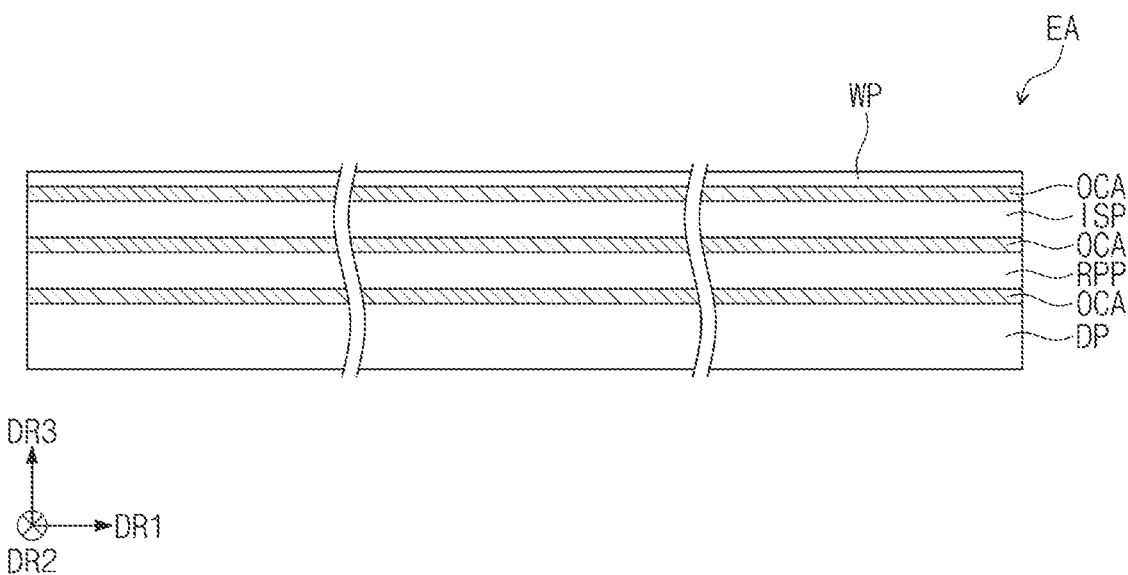
Figure 2C:
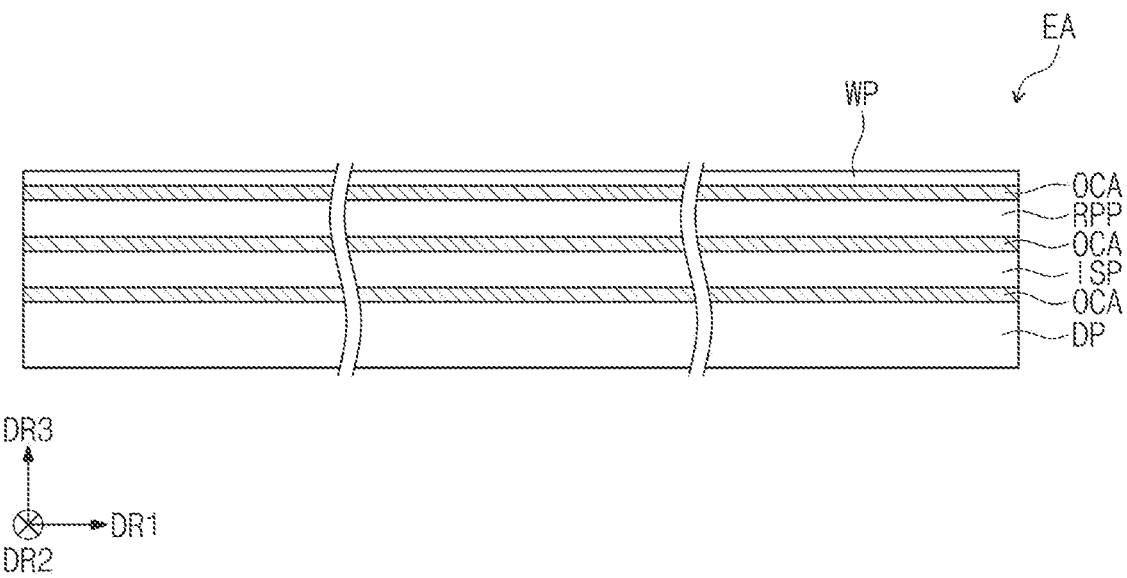
Figure 2D:
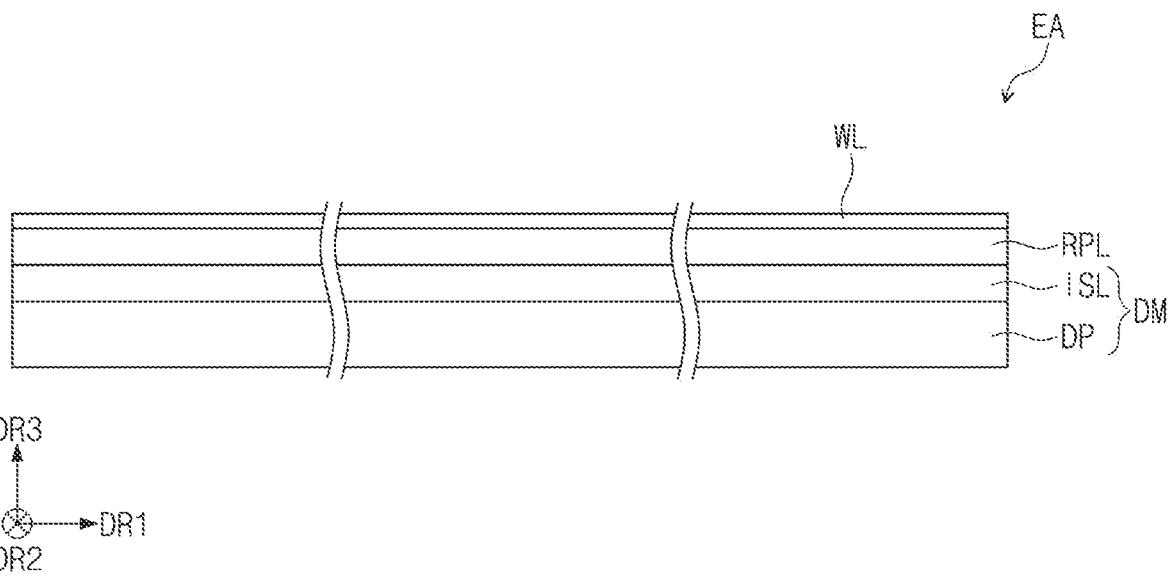

The light blocking pattern WP-BZ may have a multi-layered structure. The multi-layered structure may include a colored layer and a light blocking layer having a black color. The colored layer and the light blocking layer having the black color may be formed by a deposition process, a printing process, and/or a coating process. According to some example embodiments, the window panel WP may further include a functional coating layer located on a front surface of the base layer WP-BS. The functional coating layer may include at least one of an anti-fingerprint layer, an anti-reflection layer, or a hard coating layer. In FIGS. 2B to 2D referred hereinafter, the window panel WP and the window layer WL are simply illustrated without distinguishing the base layer WP-BS and the light blocking pattern WP-BZ, for the purpose of ease and convenience in illustration.

As illustrated in FIGS. 2B and 2C, the display device EA may include the display panel DP, the input sensing panel ISP, the anti-reflection panel RPP, and the window panel WP. A stacking order of the input sensing panel ISP and the anti-reflection panel RPP may be changed.

As illustrated in FIG. 2D, the display device EA may include the display panel DP, the input sensing layer ISL, the anti-reflection layer RPL, and the window layer WL. As compared with the display device EA of FIG. 2A, the optically clear adhesive members OCA may be omitted in the display device EA of FIG. 2D. In addition, the input sensing layer ISL, the anti-reflection layer RPL and the window layer WL may be integrally formed on the base surface of the display panel DP by continuous processes. A stacking order of the input sensing layer ISL and the anti-reflection layer RPL may be changed.

Figure 3:
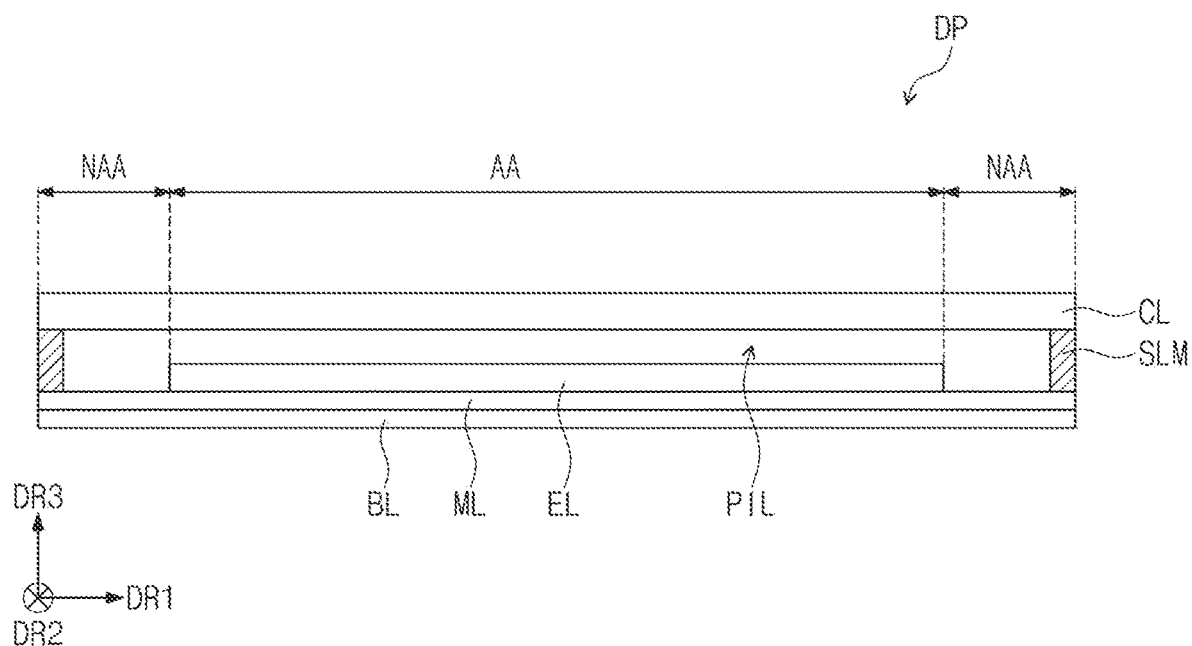
FIG. 3 is a cross-sectional view illustrating a display panel according to some example embodiments of the inventive concepts.

FIG. 3 is a cross-sectional view illustrating a display panel according to some example embodiments of the inventive concepts.

Referring to FIG. 3, the display panel DP may include a base layer BL, a circuit layer ML, a light emitting element layer EL, an encapsulation layer CL, and a coupling member SLM.

Each of the base layer BL and the encapsulation layer CL may be a plastic substrate, a glass substrate, an insulating film, or a stack structure including a plurality of insulating layers.

The circuit layer ML may be located on the base layer BL. The circuit layer ML may include a plurality of insulating layers, a plurality of conductive layers, and a semiconductor layer. The plurality of conductive layers of the circuit layer ML may constitute signal lines and/or a control circuit of a pixel.

The light emitting element layer EL may be located on the circuit layer ML. The light emitting element layer EL may be a layer for generating light. For example, the light emitting element layer EL may include organic light emitting diodes. However, embodiments of the inventive concepts are not limited thereto. In certain embodiments, the light emitting element layer EL may include inorganic light emitting diodes or organic-inorganic light emitting diodes.

The encapsulation layer CL may be located over the light emitting element layer EL. A set or predetermined space PIL may be defined between the encapsulation layer CL and the light emitting element layer EL. The space PIL may be filled with an inert gas.

The coupling member SLM may be located between the base layer BL and the encapsulation layer CL. The coupling member SLM may couple the base layer BL and the encapsulation layer CL to each other. The coupling member SLM may include an organic material such as a photocurable resin or a photoplastic resin or may include an inorganic material such as frit seal. However, embodiments of the inventive concepts are not limited thereto.

Figure 4:
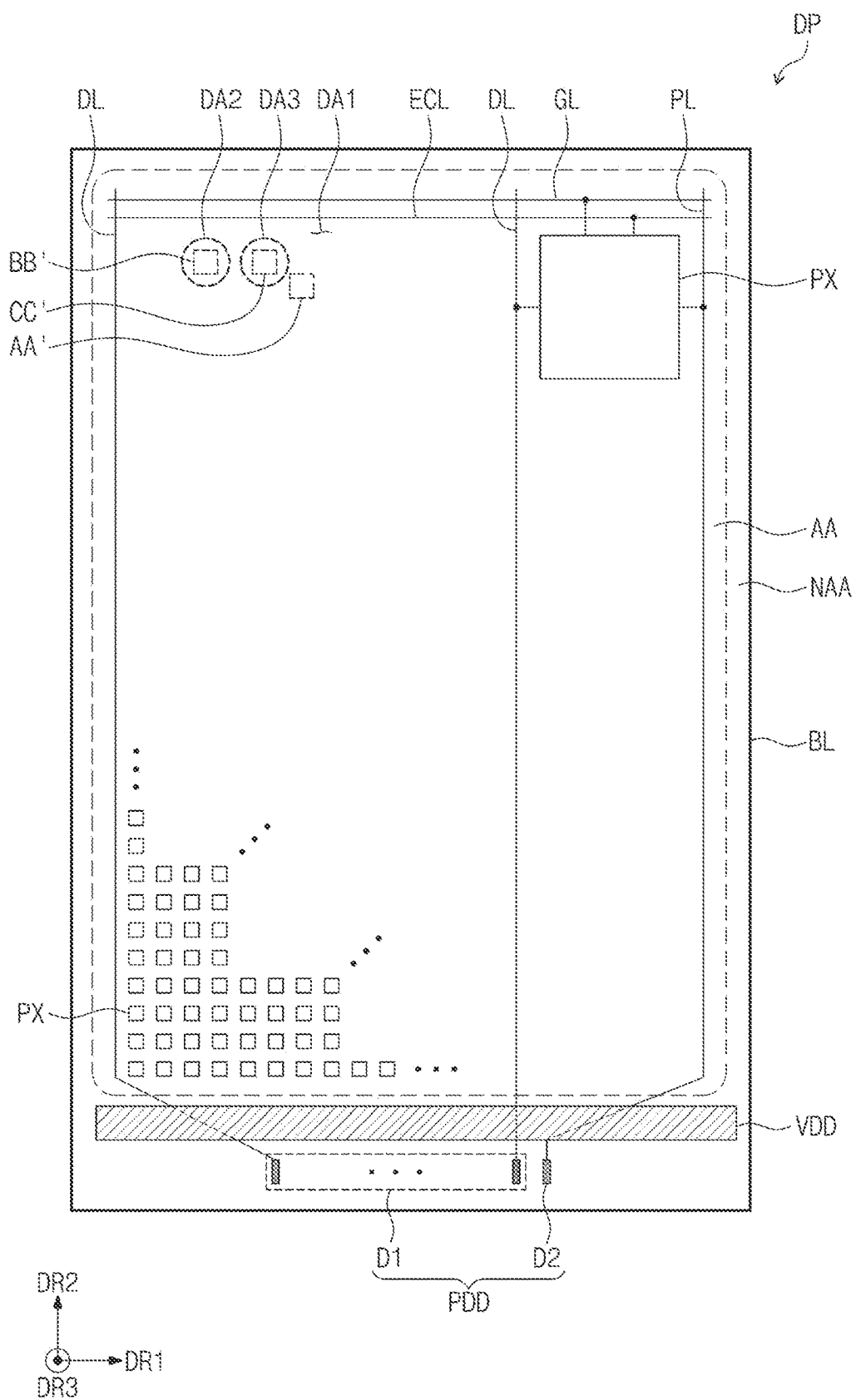
FIG. 4 is a plan view illustrating a display panel according to some example embodiments of the inventive concepts.

FIG. 4 is a plan view illustrating a display panel according to some example embodiments of the inventive concepts.

Referring to FIG. 4, the display panel DP may include the base layer BL, a plurality of pixels PX, a plurality of signal lines GL, DL, PL and ECL, and a plurality of display pads PDD.

FIG. 4 illustrates an active area AA and a peripheral area NAA of the display panel DP. The active area AA of the display panel DP may be an area in which an image is displayed, and the peripheral area NAA may be an area in which a driving circuit and/or driving lines are located. The plurality of pixels PX may be located in the active area AA.

A first area DA1, a second area DA2 and a third area DA3 may be defined in the display panel DP. The first area DA1, the second area DA2 and the third area DA3 may constitute the active area AA of the display panel DP. The first area DA1 may surround the second area DA2 and the third area DA3.

The second area DA2 may overlap with the first module SS1 (see FIG. 1B) in a plan view, and the third area DA3 may overlap with the second module SS2 (see FIG. 1B) in a plan view.

A resolution of the first area DA1 may be different from resolutions of the second area DA2 and the third area DA3. For example, the resolution of the second area DA2 may be lower than the resolution of the first area DA1. The resolution of the third area DA3 may be lower than the resolution of the first area DA1. In addition, the resolution of the third area DA3 may be lower than the resolution of the second area DA2.

Transmittances of the second area DA2 and the third area DA3 may be higher than a transmittance of the first area DA1. Thus, the first and second modules SS1 and SS2 located under the second and third areas DA2 and DA3 may easily transmit/receive signals.

The plurality of signal lines GL, DL, PL and ECL may be connected to the pixels PX and may transmit electrical signals to the pixels PX. A scan line GL, a data line DL, a power line PL and an emission control line ECL of the signal lines included in the display panel DP are illustrated as an example in FIG. 4. However, embodiments of the inventive concepts are not limited thereto. In certain embodiments, the signal lines GL, DL, PL and ECL may further include an initialization voltage line.

A power pattern VDD may be located in the peripheral area NAA. According to some example embodiments, the power pattern VDD may be connected to a plurality of the power lines PL. Because the display panel DP includes the power pattern VDD, the same first power source signal may be provided to the plurality of pixels PX.

The display pads PDD may include a first pad D1 and a second pad D2. The first pad D1 may be provided in plurality, and the plurality of first pads D1 may be connected to the data lines DL, respectively. The second pad D2 may be connected to the power pattern VDD and thus may be electrically connected to the power lines PL. The display panel DP may provide electrical signals provided from the outside to the pixels PX through the display pads PDD. According to some example embodiments, the display pads PDD may further include pads for receiving other electrical signals in addition to the first pad D1 and the second pad D2. However, the inventive concepts are not limited to one embodiment.

FIG. 5 is an enlarged plan view of an area AA' of FIG. 4.

Referring to FIGS. 4 and 5, the first area DA1 may be divided into first sub-areas AR1. At least one pixel may be located in each of the first sub-areas AR1. The first sub-areas AR1 may be arranged in the first direction DR1 and the second direction DR2. The pixels located in the first sub-areas AR1 may provide light.

FIG. 6 is an enlarged plan view of an area BB' of FIG. 4.

Referring to FIGS. 4 and 6, the second area DA2 may include a first sub-area AR1' and a second sub-area AR2. The first sub-area AR1' may be substantially similar to one of the first sub-areas AR1 of FIG. 5.

At least one pixel may be located in the first sub-area AR1', and at least one insufficient pixel may be located in the second sub-area AR2. The insufficient pixel may be a pixel in which component(s) corresponding to one or some of components of the pixel is/are omitted. The pixel located in the first sub-area AR1' may provide light. The insufficient pixel located in the second sub-area AR2 may not provide light. In other words, the second sub-area AR2 may be an area not including the pixel. The second sub-area AR2 may be referred to as a low-reflection area, a transmission area, a non-display area, a non-light emitting area, or a semi-transmission area. Because the second area DA2 includes the second sub-area AR2 which cannot provide an image, the resolution of the second area DA2 may be lower than that of the first area DA1.

The first sub-area AR1' may be provided in plurality, and the second sub-area AR2 may be provided in plurality. The first sub-areas AR1' and the second sub-areas AR2 may be arranged according to a rule (e.g., a set or predetermined rule). Referring to FIG. 6, the first sub-areas AR1' and the second sub-areas AR2 may be alternately arranged in the first direction DR1 in a first row. The first sub-areas AR1' may be arranged in the first direction DR1 in a second row. The first row and the second row may be alternately arranged in the second direction DR2.

The arrangement of the first sub-areas AR1' and the second sub-areas AR2 in FIG. 6 is illustrated as an example. However, embodiments of the inventive concepts are not limited thereto. The arrangement of the first sub-areas AR1' and the second sub-areas AR2 in the second area DA2 may be variously modified.

Figure 7:
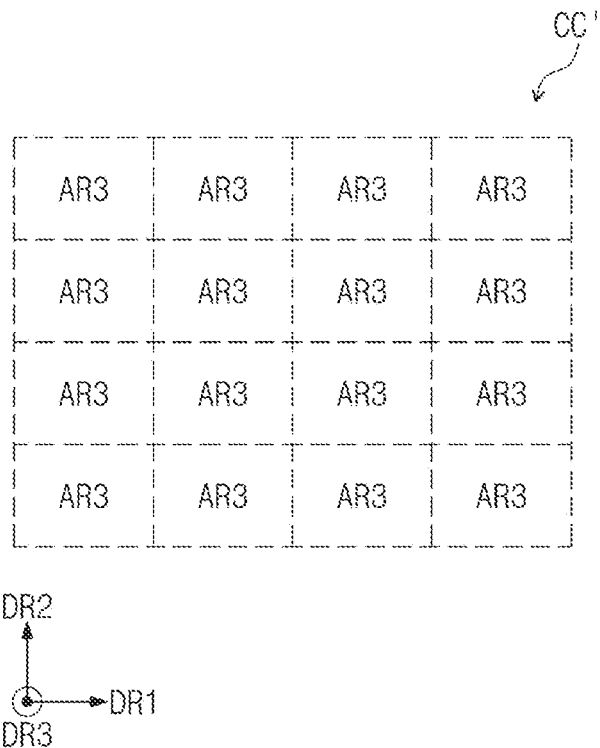
FIG. 7 is an enlarged plan view of an area CC' of FIG. 4.

FIG. 7 is an enlarged plan view of an area CC' of FIG. 4.

Referring to FIGS. 4 and 7, the third area DA3 may be divided into a plurality of third sub-areas AR3. An insufficient pixel may be located in each of the plurality of third sub-areas AR3. The third area DA3 may not include the first sub-area AR1' described above with reference to FIG. 6. Thus, the resolution of the third area DA3 may be lower than the resolution of the second area DA2. In addition, the transmittance of the third area DA3 may be higher than that of the second area DA2.

The second area DA2 (see FIG. 6) and the third area DA3 may have the transmittances higher than that of the first area DA1 (see FIG. 5). Thus, operating reliability of the first and second modules SS1 and SS2 (see FIG. 1B) located under the second and third areas DA2 and DA3 may be improved.

According to some example embodiments, all of the second area DA2 and the third area DA3 may consist of only the third sub-areas AR3. According to some example embodiments, each of the second and third areas DA2 and DA3 may include both the first sub-area AR1' and the second sub-area AR2.

Figure 8:
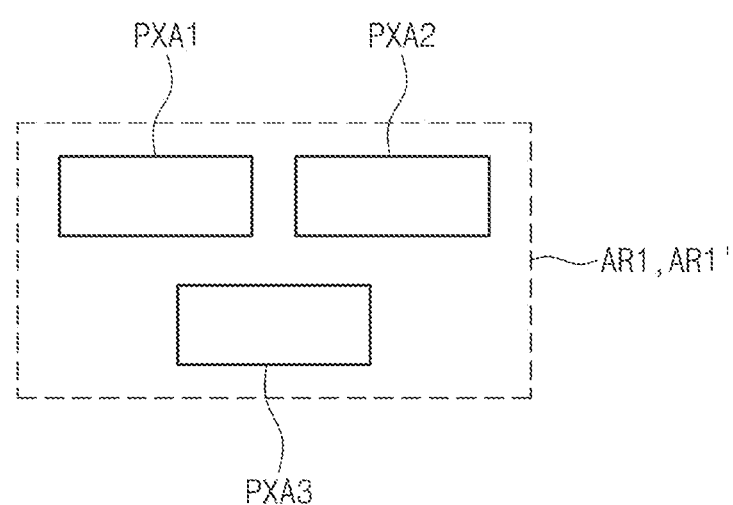
FIG. 8 is an enlarged plan view illustrating a portion of a display panel according to some example embodiments of the inventive concepts.

FIG. 8 is an enlarged plan view illustrating a portion of a display panel according to some example embodiments of the inventive concepts. For example, FIG. 8 may be a plan view illustrating pixel areas located in the first sub-area AR1 described in FIG. 5 or the first sub-area AR1' described in FIG. 6.

Referring to FIG. 8, each of the first sub-areas AR1 and AR1' may include a first pixel area PXA1, a second pixel area PXA2, and a third pixel area PXA3. Each of the first, second and third pixel areas PXA1, PXA2 and PXA3 may have a rectangular shape. The first, second and third pixel areas PXA1, PXA2 and PXA3 may be defined long in a horizontal direction.

The display panel DP (see FIG. 4) may provide red light through the first pixel area PXA1, may provide green light through the second pixel area PXA2, and may provide blue light through the third pixel area PXA3.

The arrangement and the shapes of the first, second and third pixel areas PXA1, PXA2 and PXA3 are illustrated as an example in FIG. 8. However, embodiments of the inventive concepts are not limited thereto. The arrangement and the shapes of the first, second and third pixel areas PXA1, PXA2 and PXA3 may be variously modified.

Figure 9:
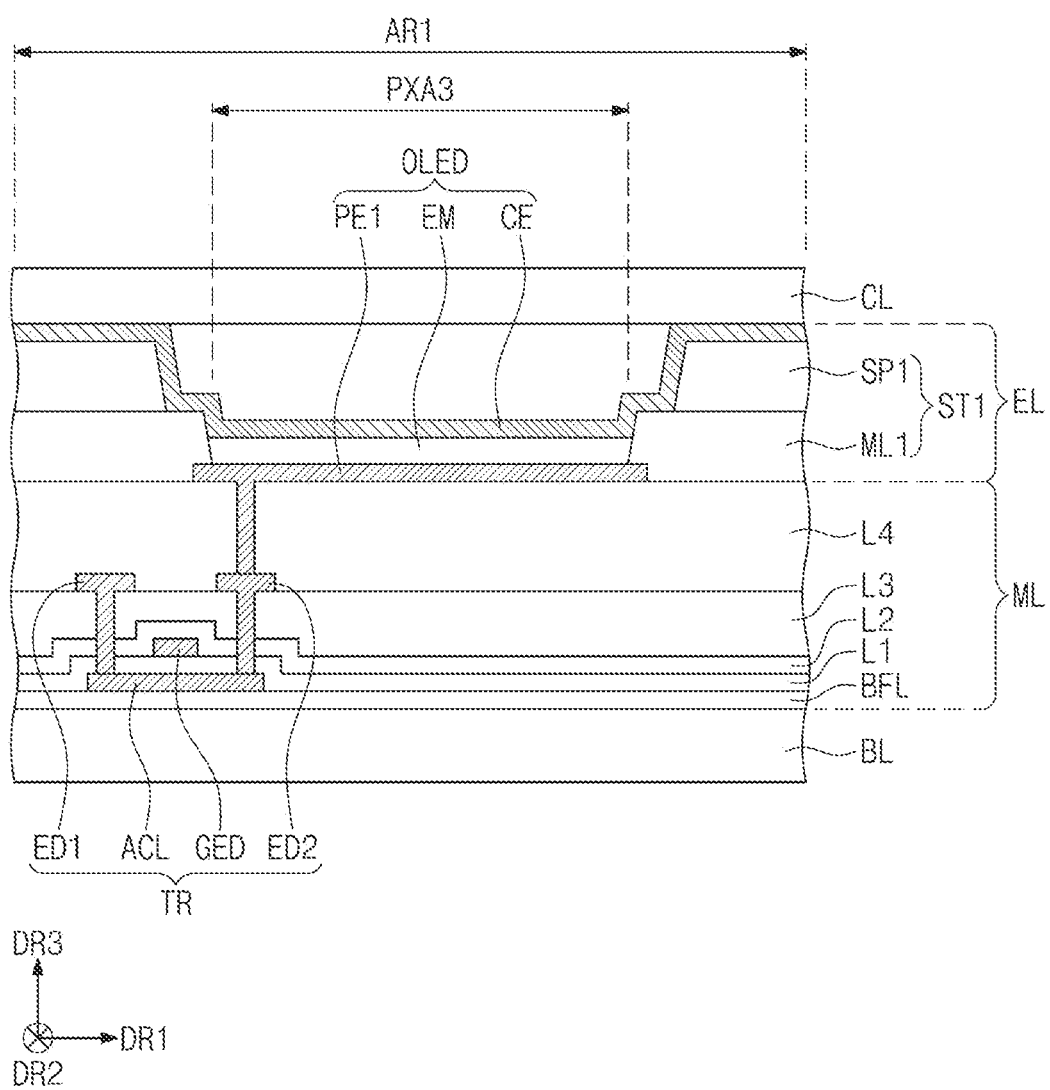
FIG. 9 is a cross-sectional view illustrating a portion of a display panel according to some example embodiments of the inventive concepts.

FIG. 9 is a cross-sectional view illustrating a portion of a display panel according to some example embodiments of the inventive concepts. An area illustrated in FIG. 9 may be the first sub-area AR1. The first sub-area AR1 may be included in the first area DA1 (see FIG. 4).

Referring to FIGS. 4 and 9, each of the pixels PX may include a light emitting element OLED and a pixel circuit. The pixel circuit may include a plurality of transistors, signal lines GL, DL, PL and ECL, and a capacitor. In FIG. 9, one transistor TR is illustrated as an example. A pixel area may be defined in each of the pixels PX, and a single pixel area PXA3 is illustrated in FIG. 9.

The display panel DP may include a base layer BL, a circuit layer ML, a light emitting element layer EL, and an encapsulation layer CL. The circuit layer ML may include the transistor TR and a plurality of insulating layers BFL, L1, L2, L3 and L4.

The insulating layer BFL may be located on the base layer BL, and the transistor TR may be located on the insulating layer BFL. The transistor TR may include a semiconductor layer ACL, a control electrode GED, a first electrode ED1, and a second electrode ED2.

The semiconductor layer ACL may be located on the insulating layer BFL. The insulating layer BFL may be a buffer layer for providing low surface energy to the semiconductor layer ACL. In this case, the semiconductor layer ACL may have a higher adhesive strength to the insulating layer BFL than to the base layer BL. In addition, the insulating layer BFL may be a barrier layer for protecting a bottom surface of the semiconductor layer ACL. In this case, the insulating layer BFL may inhibit or prevent a contaminant or moisture from permeating into the semiconductor layer ACL from the inside of the base layer BL or through the base layer BL. According to some example embodiments, the insulating layer BFL may be a light blocking layer for preventing external light from being incident to the semiconductor layer ACL through the base layer BL. In this case, the insulating layer BFL may further include a light blocking material.

The semiconductor layer ACL may include poly-silicon or amorphous silicon. Alternatively, the semiconductor layer ACL may include a metal oxide semiconductor. The semiconductor layer ACL may include a channel region functioning as a path through which electrons or holes move, and first and second ion-doped regions spaced apart from each other with the channel region interposed therebetween.

A first insulating layer L1 may be located on the insulating layer BFL and may cover the semiconductor layer ACL. The first insulating layer L1 may include an inorganic material. The inorganic material may include at least one of silicon nitride, silicon oxynitride, silicon oxide, titanium oxide, or aluminum oxide.

The control electrode GED may be located on the first insulating layer L1. A second insulating layer L2 may be located on the first insulating layer L1 and may cover the control electrode GED. The second insulating layer L2 may include an inorganic material.

A third insulating layer L3 may be located on the second insulating layer L2. The first electrode ED1 and the second electrode ED2 may be located on the third insulating layer L3. The first electrode ED1 and the second electrode ED2 may be connected to the semiconductor layer ACL through through-holes penetrating the first, second and third insulating layers L1, L2 and L3.

A fourth insulating layer L4 may be located on the third insulating layer L3 and may cover the first electrode ED1 and the second electrode ED2. The fourth insulating layer L4 may be a single layer or may include a plurality of layers. For example, the single layer may include an organic layer. The plurality of layers may include an organic layer and an inorganic layer which are stacked. The fourth insulating layer L4 may be a planarization layer providing a flat top surface.

The light emitting element layer EL may be located on the fourth insulating layer L4. The light emitting element layer EL may include the light emitting element OLED and a first stack structure ST1. The light emitting element OLED may include a first pixel electrode PE1, an emission layer EM, and a common electrode CE. The first pixel electrode PE1 may be located on the fourth insulating layer L4 and may be electrically connected to the second electrode ED2 through a through-hole defined in the fourth insulating layer L4. In addition, the first pixel electrode PE1 may be located in the first area DA1.

The emission layer EM may be located on the first pixel electrode PE1. The emission layer EM may have a single-layered structure formed of a single material, a single-layered structure formed of different materials from each other, or a multi-layered structure including a plurality of layers formed of different materials from each other. The emission layer EM may include an organic material. The organic material may include a generally used material. For example, the emission layer EM may include at least one of materials emitting red light, green light and blue light. According to some example embodiments, the emission layer EM may include a fluorescent material or a phosphorescent material.

The first stack structure ST1 may be located adjacent to the first pixel electrode PE1. The first stack structure ST1 may include a first intermediate layer ML1 and a first spacer SP1.

The first intermediate layer ML1 may be located on the circuit layer ML to define the pixel area PXA3. The first intermediate layer ML1 may be located on the fourth insulating layer L4 and may expose at least a portion of the first pixel electrode PE1. A portion of the first pixel electrode PE1 may not be covered by the first intermediate layer ML1, and the portion may correspond to the pixel area PXA3. The first intermediate layer ML1 may be referred to as a pixel defining layer.

The first spacer SP1 may be located on the first intermediate layer ML1. An area (or size) of the first spacer SP1 may be less than an area (or size) of the first intermediate layer ML1 when viewed in a plan view. Thus, a portion of a top surface of the first intermediate layer ML1 may be exposed by the first spacer SP1. The first spacer SP1 may support the encapsulation layer CL.

The common electrode CE may be located on the emission layer EM and the first stack structure ST1. The common electrode CE may be located on a side surface and the exposed top surface of the first intermediate layer ML1 and a side surface and a top surface of the first spacer SP1.

According to some example embodiments, a protective layer covering the common electrode CE may further be provided. The protective layer may include an inorganic material and may prevent the common electrode CE from being oxidized.

Figure 10:
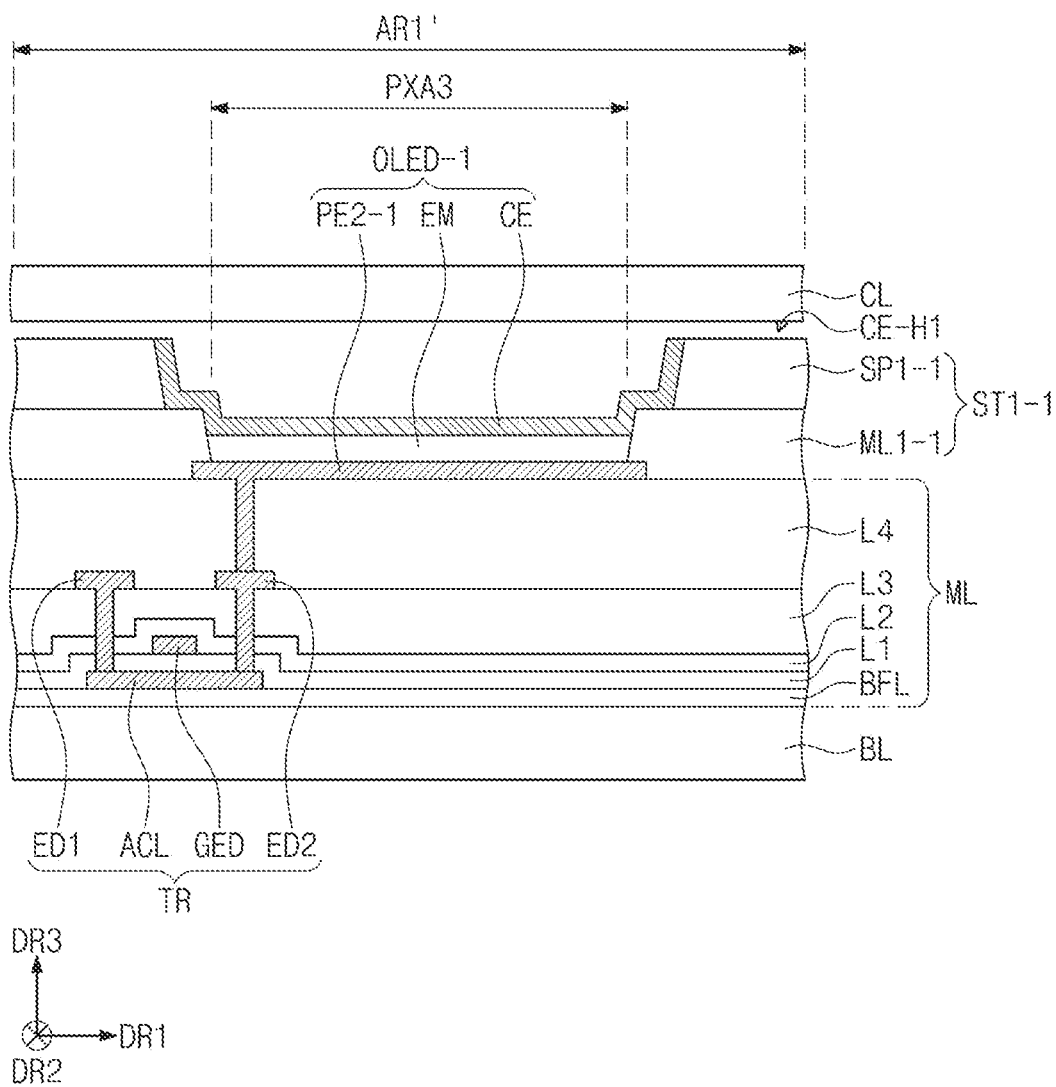
FIG. 10 is a cross-sectional view illustrating a portion of a display panel according to some example embodiments of the inventive concepts.
Figure 11:
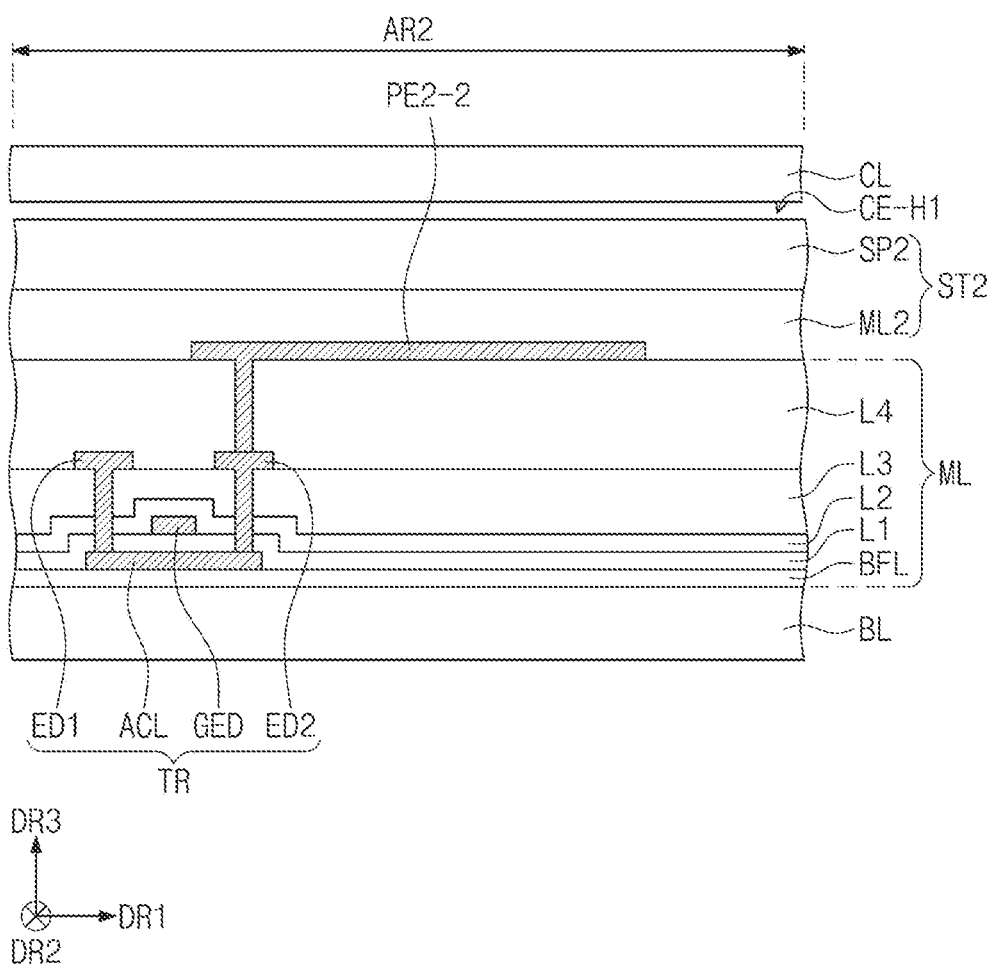
FIG. 11 is a cross-sectional view illustrating a portion of a display panel according to some example embodiments of the inventive concepts.

FIG. 10 is a cross-sectional view illustrating a portion of a display panel according to some example embodiments of the inventive concepts. FIG. 11 is a cross-sectional view illustrating a portion of a display panel according to some example embodiments of the inventive concepts. An area illustrated in FIG. 10 may be the first sub-area AR1'. An area illustrated in FIG. 11 may be the second sub-area AR2. The first sub-area AR1' and the second sub-area AR2 may be included in the second area DA2 (see FIG. 4). The first sub-area AR1' may provide light, and the second sub-area AR2 may not provide light.

Referring to FIG. 10, a light emitting element OLED-1 may include a second pixel electrode PE2-1, an emission layer EM, and a common electrode CE. The second pixel electrode PE2-1 may be electrically connected to the circuit layer ML. The second pixel electrode PE2-1 may be located in the first sub-area AR1'.

A first stack structure ST1-1 may be located adjacent to the second pixel electrode PE2-1. The first stack structure ST1-1 may include a first intermediate layer ML1-1 and a first spacer SP1-1. The first stack structure ST1-1 may have the same structure as the first stack structure ST1 described with reference to FIG. 9.

The common electrode CE may be located on the emission layer EM. In addition, the common electrode CE may also be located on a portion of the first stack structure ST1-1.

For example, the common electrode CE may be located on a side surface of the first intermediate layer ML1-1, a top surface of the first intermediate layer ML1-1 exposed by the first spacer SP1-1, and a side surface of the first spacer SP1-1. The common electrode CE may not be located on a top surface of the first spacer SP1-1. For example, a first hole CE-H1 may be provided in the common electrode CE. The first hole CE-H1 may be provided in an area overlapping with the first spacer SP1-1.

Referring to FIG. 11, a second pixel electrode PE2-2 may be located in the second sub-area AR2. A second stack structure ST2 may be located adjacent to the second pixel electrode PE2-2. The second stack structure ST2 may have a shape different from those of the first stack structure ST1 (see FIG. 9) and the first stack structure ST1-1 (see FIG. 10). For example, the second stack structure ST2 may include a second intermediate layer ML2 and a second spacer SP2. The second intermediate layer ML2 may completely cover the second pixel electrode PE2-2. In the second sub-area AR2, an area (or size) of the second intermediate layer ML2 may be equal to an area (or size) of the second spacer SP2 when viewed in a plan view. Thus, a top surface of the second intermediate layer ML2 may be fully covered by the second spacer SP2.

The second intermediate layer ML2 may be formed of the same material as the first intermediate layer ML1 (see FIG. 9) and the first intermediate layer ML1-1 (see FIG. 10) by the same process. The second spacer SP2 may be formed of the same material as the first spacer SP1 (see FIG. 9) and the first spacer SP1-1 (see FIG. 10) by the same process.

The common electrode CE is not located in the second sub-area AR2. For example, a second hole CE-H2 may be provided in the common electrode CE. The second hole CE-H2 may be provided in an area corresponding to the second sub-area AR2.

Figure 12:
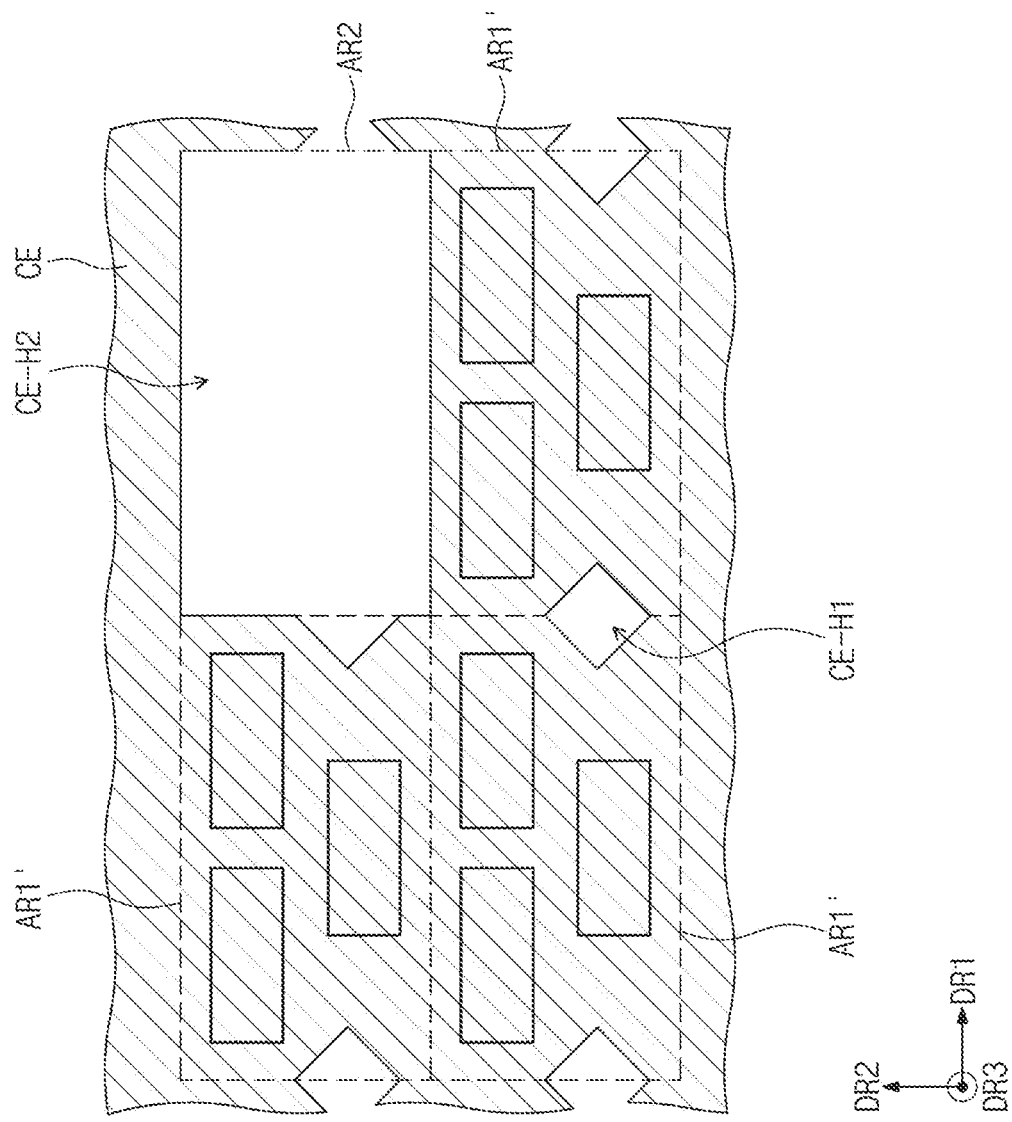
FIG. 12 is a plan view illustrating some components of a display panel according to some example embodiments of the inventive concepts.

FIG. 12 is a plan view illustrating some components of a display panel according to some example embodiments of the inventive concepts.

Referring to FIG. 12, three first sub-areas AR1', the second sub-area AR2 and the common electrode CE are illustrated.

The first hole CE-H1 and the second hole CE-H2 may be defined in the common electrode CE. The first hole CE-H1 and the second hole CE-H2 may be formed by removing portions of the common electrode CE. Because the portions of the common electrode CE are removed, transmittances of the first sub-areas AR1' and the second sub-area AR2 may be improved. The first hole CE-H1 may be provided in the first sub-area AR1', and the second hole CE-H2 may be provided in the second sub-area AR2. In particular, the first hole CE-H1 may be provided on the first spacer SP1-1 (see FIG. 10).

Figure 13:
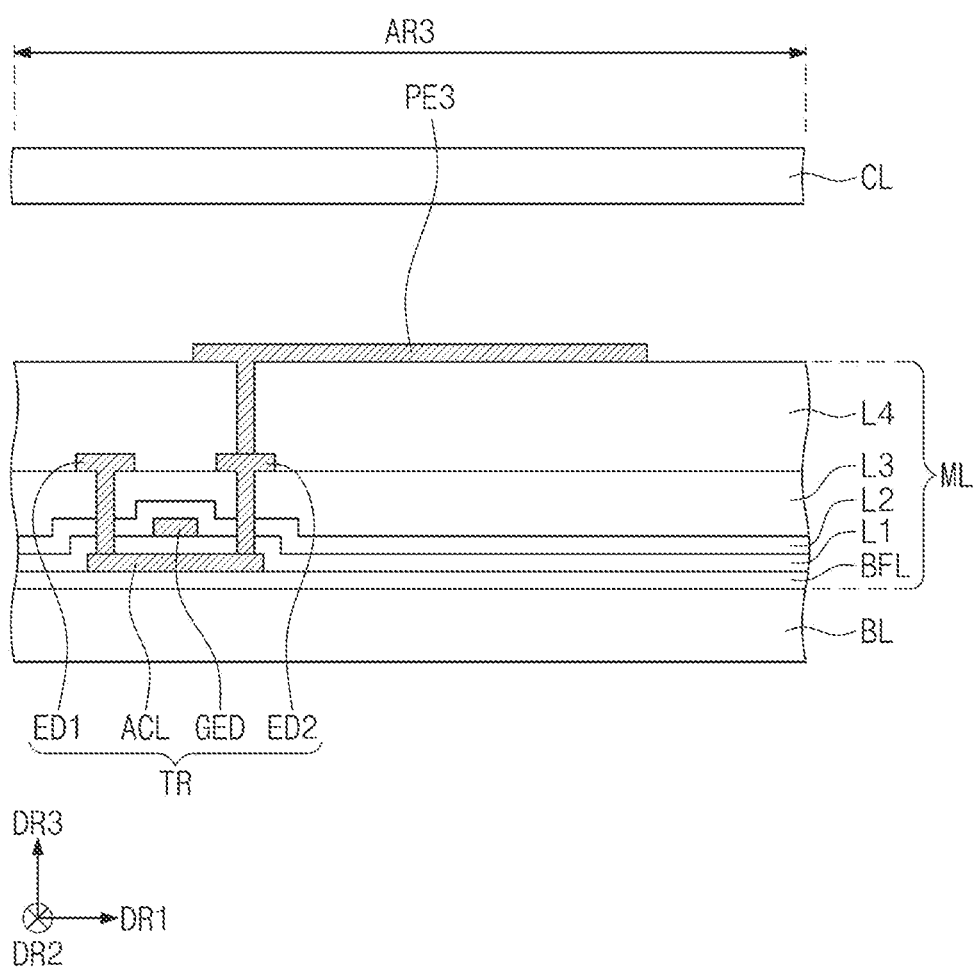
FIG. 13 is a cross-sectional view illustrating a portion of a display panel according to some example embodiments of the inventive concepts.

FIG. 13 is a cross-sectional view illustrating a portion of a display panel according to some example embodiments of the inventive concepts. An area illustrated in FIG. 13 may be the third sub-area AR3. The third sub-area AR3 may be included in the third area DA3 (see FIG. 4). The third sub-area AR3 may not provide light.

Referring to FIG. 13, a third pixel electrode PE3 may be located on the circuit layer ML. In addition, the third pixel electrode PE3 may be located in the third sub-area AR3. The third pixel electrode PE3 may be electrically connected to the circuit layer ML.

The encapsulation layer CL may be located on the third pixel electrode PE3. The encapsulation layer CL may be spaced apart from the third pixel electrode PE3.

The first intermediate layer ML1 (see FIG. 9) and the first spacer SP1 (see FIG. 9) may not be located in the third sub-area AR3. In addition, the common electrode CE (see FIG. 12) may not be located in the third sub-area AR3. Thus, a transmittance of the third sub-area AR3 may be improved.

Figure 14:
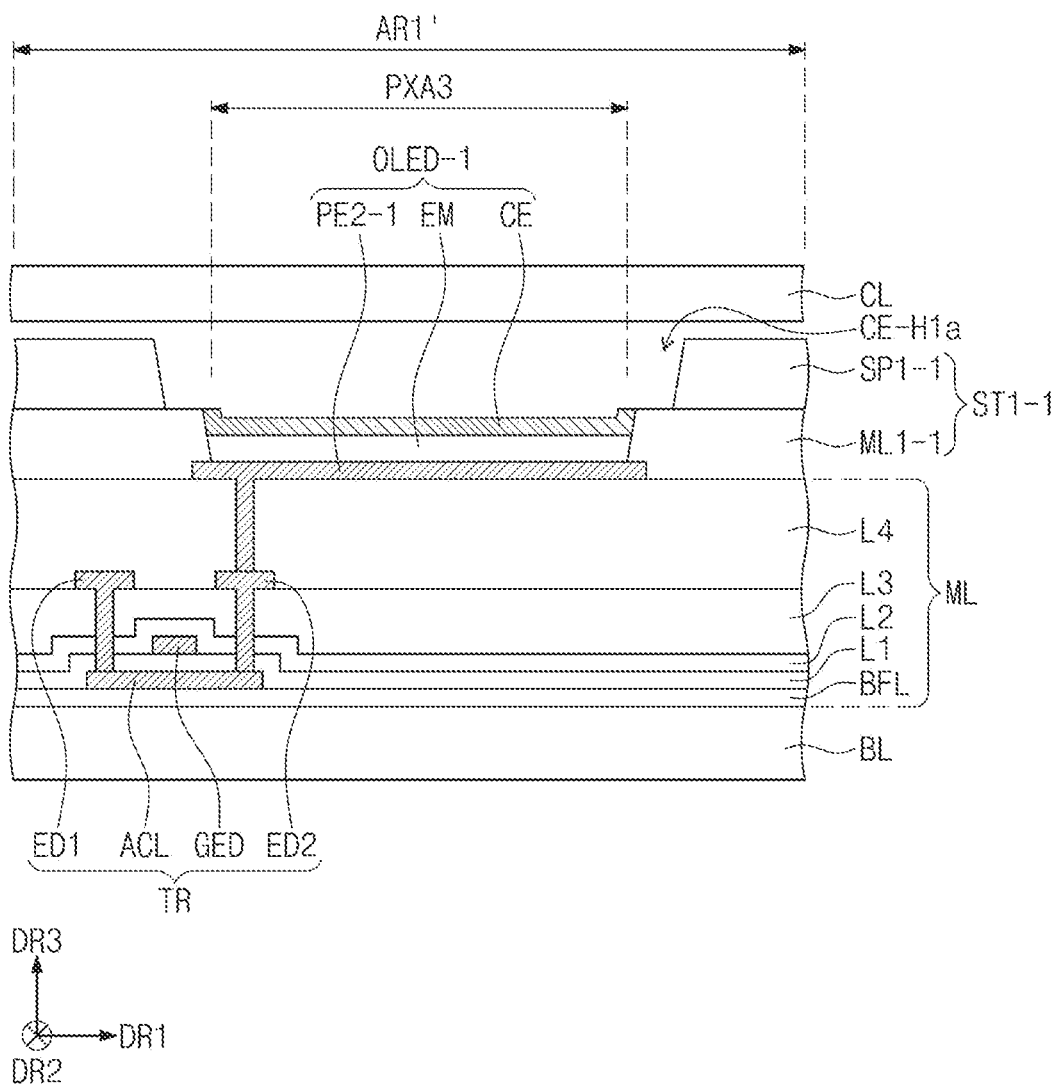
FIG. 14 is a cross-sectional view illustrating a portion of a display panel according to some example embodiments of the inventive concepts.

FIG. 14 is a cross-sectional view illustrating a portion of a display panel according to some example embodiments of the inventive concepts. An area illustrated in FIG. 14 may be the first sub-area AR1'. In the embodiment of FIG. 14, the same components as described with reference to FIG. 10 will be indicated by the same reference designators, and differences between the embodiment of FIG. 14 and the embodiment of FIG. 10 will be mainly described.

Referring to FIG. 14, a first hole CE-H1a may be provided in the common electrode CE. The top surface and the side surface of the first spacer SP1-1 and a portion of the top surface of the first intermediate layer ML1-1 may be exposed by the first hole CE-H1a. An area of the first hole CE-H1a of FIG. 14 may be greater than an area of the first hole CE-H1 of FIG. 10. In this case, a transmittance of the first sub-area AR1' may be more improved.

Figure 15:
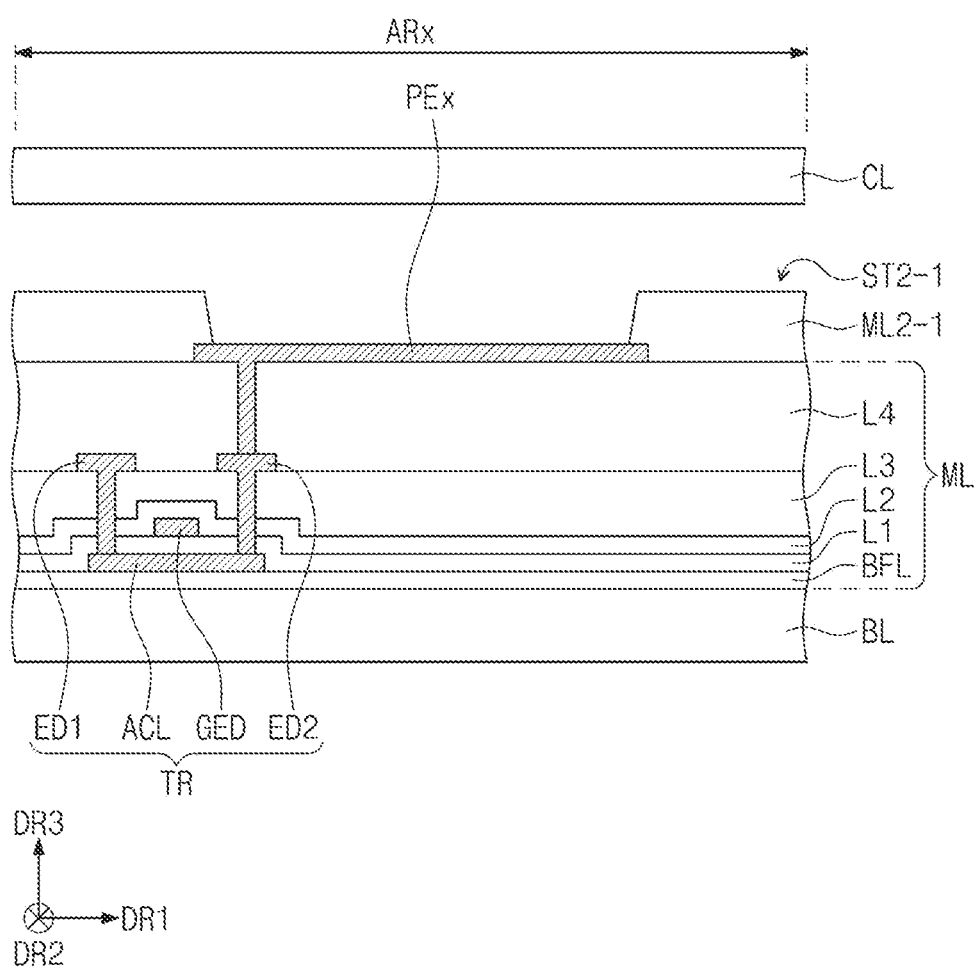
FIG. 15 is a cross-sectional view illustrating a portion of a display panel according to some example embodiments of the inventive concepts.

FIG. 15 is a cross-sectional view illustrating a portion of a display panel according to some example embodiments of the inventive concepts. A sub-area ARx illustrated in FIG. 15 may correspond to the second sub-area AR2 of FIG. 6 or the third sub-area AR3 of FIG. 7. In the embodiment of FIG. 15, the same components as described with reference to FIG. 11 will be indicated by the same reference designators, and differences between the embodiment of FIG. 15 and the embodiment of FIG. 11 will be mainly described.

Referring to FIG. 15, a pixel electrode PEx may be located in the sub-area ARx. The pixel electrode PEx may be electrically connected to the circuit layer ML. The pixel electrode PEx may correspond to the second pixel electrode PE2-2 (see FIG. 11) or the third pixel electrode PE3 (see FIG. 13).

A second stack structure ST2-1 may be located adjacent to the pixel electrode PEx. The second stack structure ST2-1 may include a second intermediate layer ML2-1. The number of the layer constituting the second stack structure ST2-1 may be different from the number of the layers constituting each of the first stack structures ST1 and ST1-1 (see FIGS. 9 and 10). Thus, the maximum thickness of the second stack structure ST2-1 may be less than the maximum thickness of each of the first stack structures ST1 and ST1-1 (see FIGS. 9 and 10).

Figure 16:
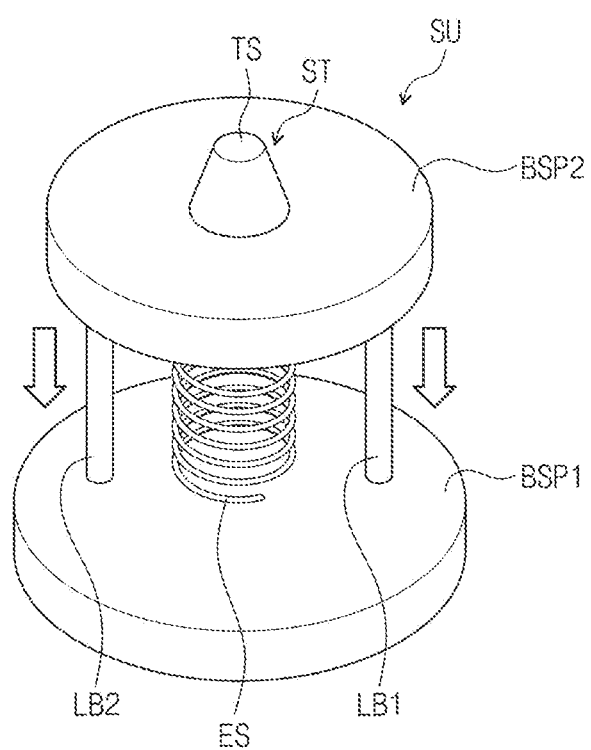
FIG. 16 is a perspective view illustrating a stamping unit according to some example embodiments of the inventive concepts.

FIG. 16 is a perspective view illustrating a stamping unit according to some example embodiments of the inventive concepts.

Referring to FIG. 16, a stamping unit SU may include a first base plate BSP1, a second base plate BSP2, a stamp ST, a guide member LB1 and LB2, and an elastic member ES.

The first base plate BSP1 may be coupled to a stamping substrate to fix the stamping unit SU to the stamping substrate. The second base plate BSP2 may be spaced apart from the first base plate BSP1 by a distance (e.g., a set or predetermined distance) and may be located in parallel to the first base plate BSP1. The stamp ST may be located on a top surface of the second base plate BSP2.

The stamp ST may be formed of a rubber material having an adhesive property. For example, the stamp ST may be formed of, but not limited to, polydimethylsiloxane or silicon. In addition, an adhesive strength of the stamp ST may be 300 gf/inch or more.

The stamp ST may be fixed to the second base plate BSP2 by an additional fixing member. The stamp ST may be detachably fixed to the second base plate BSP2, and thus the stamp ST may be easily replaced when the adhesive strength of the stamp ST is weakened.

The first and second base plates BSP1 and BSP2 may be connected to each other through the guide member LB1 and LB2. When external force is applied to the first and second base plates BSP1 and BSP2, the second base plate BSP2 may move along the guide member LB1 and LB2 in a direction toward the first base plate BSP1. For example, the guide member LB1 and LB2 may have two guide bars as illustrated in FIG. 16. However, the number of the guide bars is not limited thereto.

The elastic member ES may be provided between the first and second base plates BSP1 and BSP2. When force is applied to the first and second base plates BSP1 and BSP2, the elastic member ES may be contracted by elasticity and restoring force of the elastic member ES may be transferred to the stamp ST located on the second base plate BSP2, and thus the stamp ST may come in close contact with a work object.

In FIG. 16, a top surface TS and a bottom surface of the stamp ST may have circular shapes, and the stamp ST may have a truncated cone shape where a diameter of the top surface TS is less than a diameter of the bottom surface. However, the shape of the stamp ST is not limited thereto.

Figure 17A:
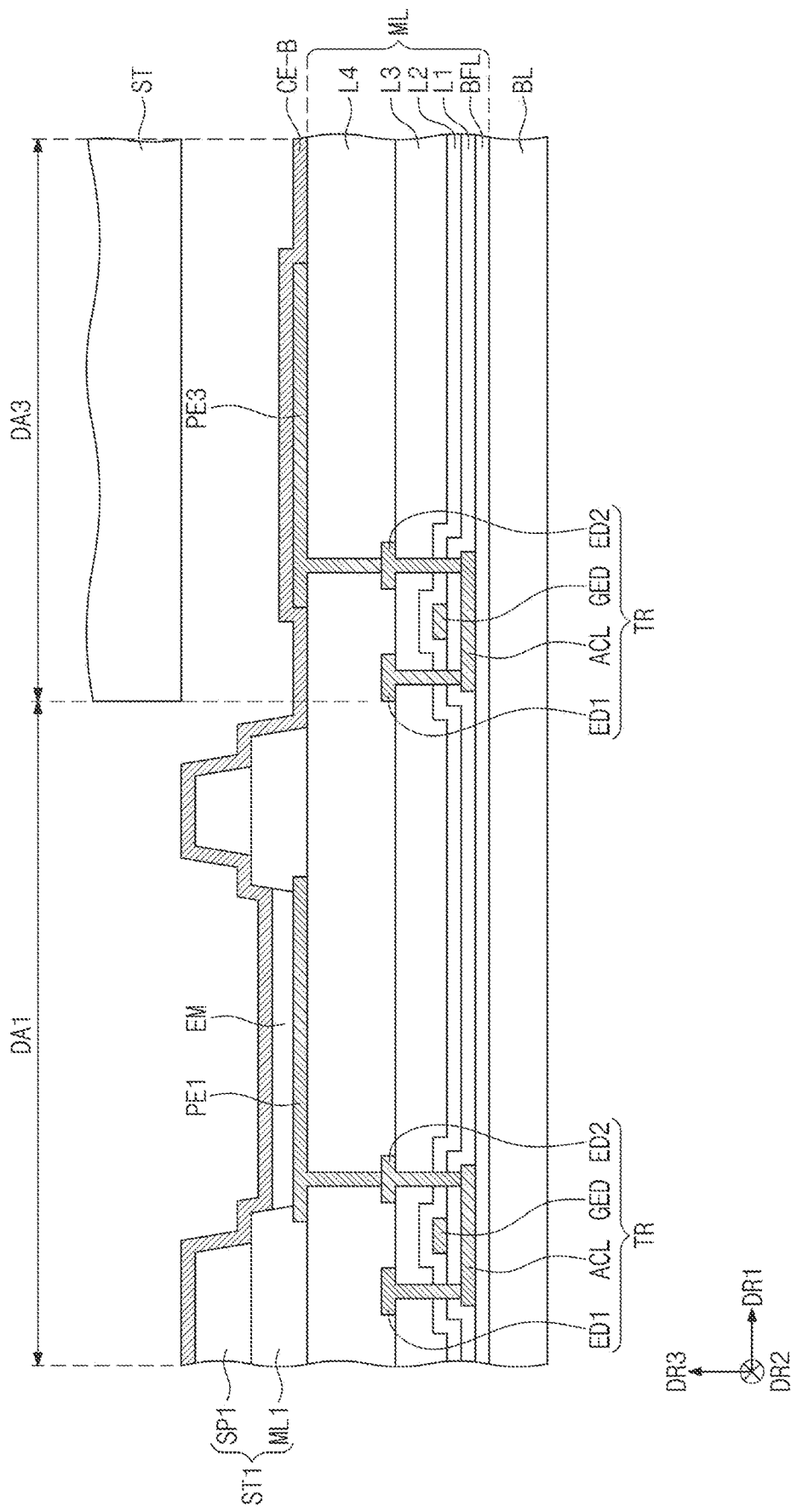
FIGS. 17A and 17B are cross-sectional views illustrating some processes of a method for manufacturing a display device according to some example embodiments of the inventive concepts.
Figure 17B:
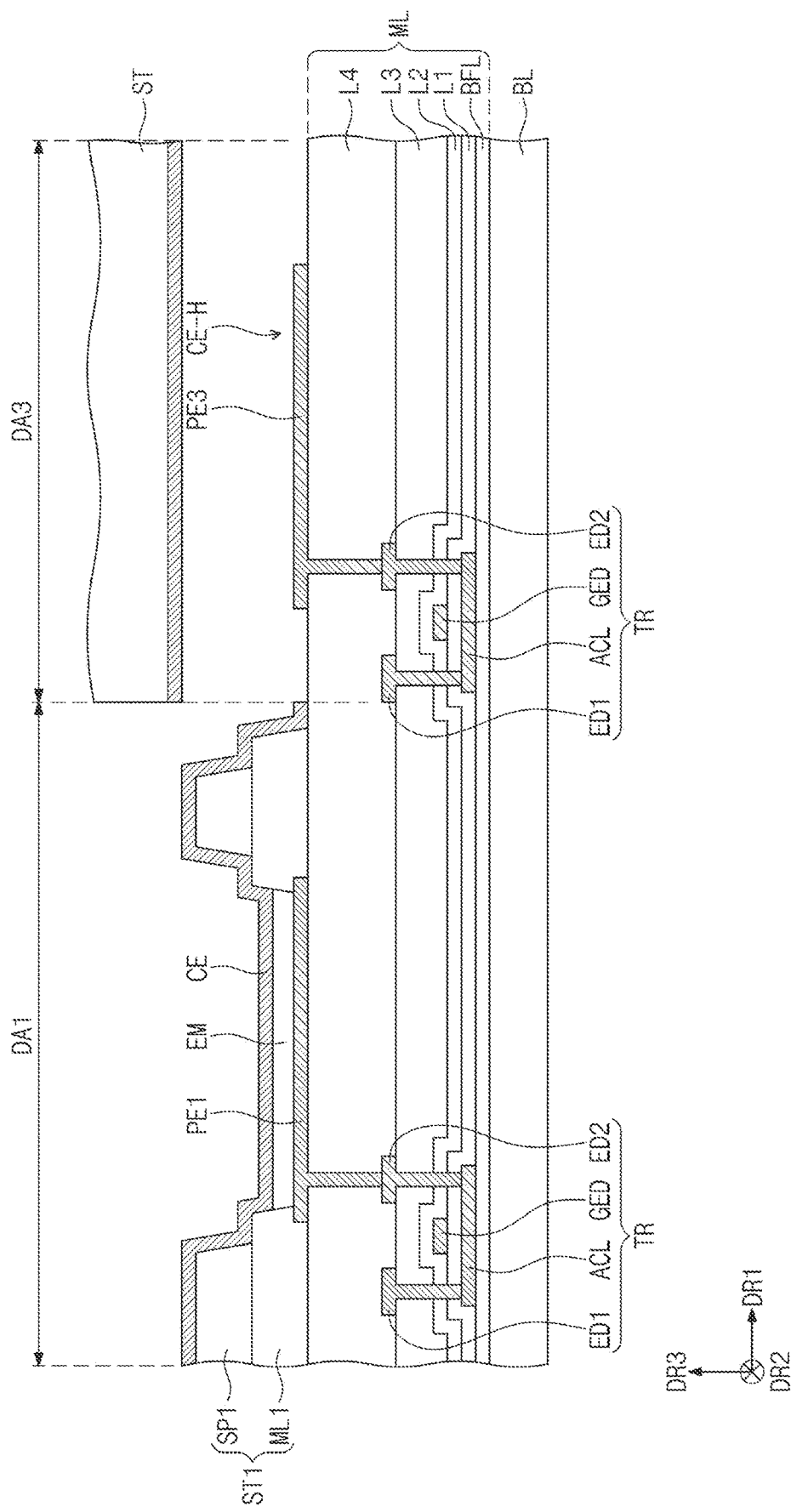

FIGS. 17A and 17B are cross-sectional views illustrating some processes of a method for manufacturing a display device according to some example embodiments of the inventive concepts.

Referring to FIGS. 17A and 17B, a base layer BL may be formed. A circuit layer ML may be formed on the base layer BL. A first pixel electrode PE1 and a third pixel electrode PE3 may be formed on the circuit layer ML.

A first stack structure ST1 may be formed in an area adjacent to the first pixel electrode PE1. The first stack structure ST1 may include a first intermediate layer ML1 and a first spacer SP1. The first intermediate layer ML1 and the first spacer SP1 may not be located on the third pixel electrode PE3.

A common electrode layer CE-B may be formed. The common electrode layer CE-B may cover the first stack structure ST1, the emission layer EM, and the third pixel electrode PE3. According to some example embodiments, the emission layer EM may also be located between the third pixel electrode PE3 and the common electrode layer CE-B.

A portion of the common electrode layer CE-B may be removed using a stamping process. Thus, a transmittance of an area in which the portion of the common electrode layer CE-B is removed may be improved. The stamp ST may come in contact with a portion of the common electrode layer CE-B, which corresponds to the third area DA3. The portion being in contact with the stamp ST may be adhered to the stamp ST. Thus, a hole CE-H may be formed in the common electrode layer CE-B.

Figure 18A:
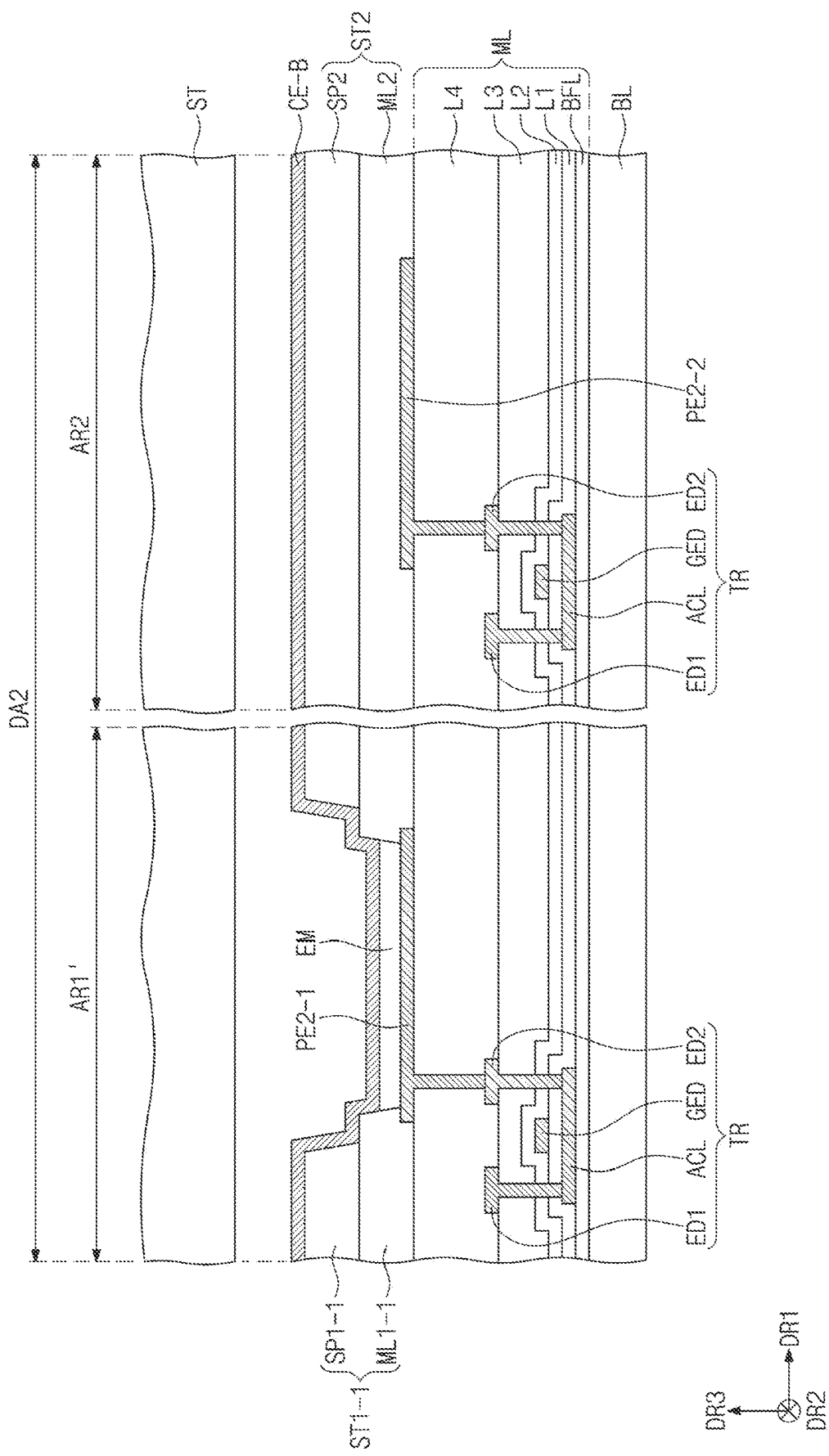
FIGS. 18A and 18B are cross-sectional views illustrating some processes of a method for manufacturing a display device according to some example embodiments of the inventive concepts.
Figure 18B:
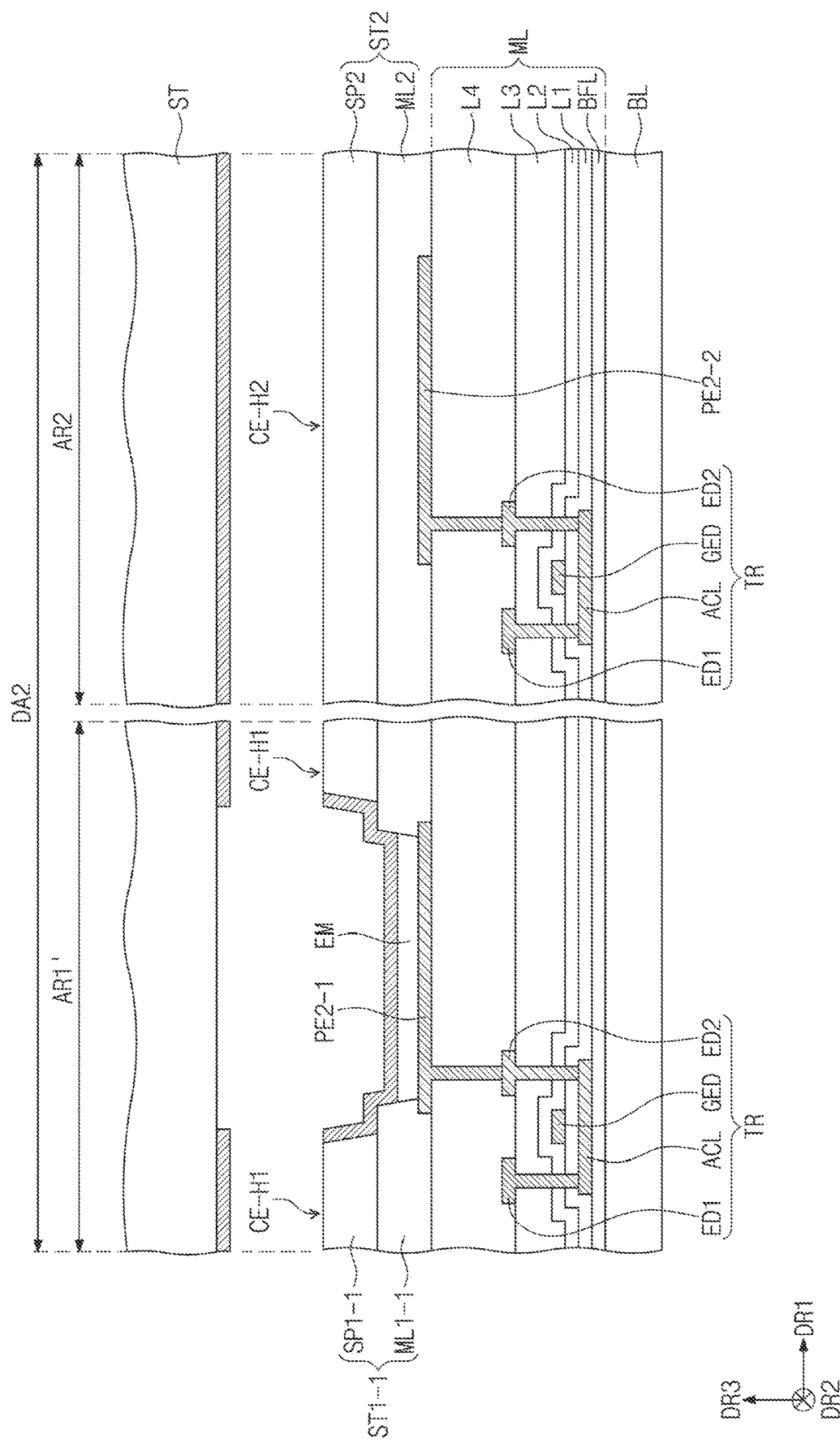

FIGS. 18A and 18B are cross-sectional views illustrating some processes of a method for manufacturing a display device according to some example embodiments of the inventive concepts.

Referring to FIGS. 18A and 18B, second pixel electrodes PE2-1 and PE2-2 may be formed on the circuit layer ML. The second pixel electrode PE2-1 may be formed in the first sub-area AR1', and the second pixel electrode PE2-2 may be formed in the second sub-area AR2.

A first stack structure ST1-1 may be formed in an area adjacent to the second pixel electrode PE2-1. The first stack structure ST1-1 may include a first intermediate layer ML1-1 and a first spacer SP1-1. A second stack structure ST2 may be formed in an area adjacent to the second pixel electrode PE2-2. The second stack structure ST2 may include a second intermediate layer ML2 and a second spacer SP2.

The first stack structure ST1-1 and the second stack structure ST2 may have different structures from each other. For example, the first and second stack structures ST1-1 and ST2 may include the same layers, but the second intermediate layer ML2 and the second spacer SP2 may completely cover the second pixel electrode PE2-2. In other words, shapes of the first stack structure ST1-1 and the second stack structure ST2 may be different from each other.

According to some example embodiments, the first intermediate layer ML1 (see FIG. 17A), the first intermediate layer ML1-1 and the second intermediate layer ML2 may be formed at the same time by the same process. In addition, the first spacer SP1 (see FIG. 17A), the first spacer SP1-1 and the second spacer SP2 may be formed at the same time by the same process.

The common electrode layer CE-B may be formed on the first stack structure ST1-1, the second stack structure ST2, and the emission layer EM. A portion of the common electrode layer CE-B may be removed using the stamping process. Thus, a transmittance of an area in which the portion of the common electrode layer CE-B is removed may be improved.

The stamp ST may come in contact with portions of the common electrode layer CE-B, which correspond to the second area DA2. The portions of the common electrode layer CE-B, which are in contact with the stamp ST, may be adhered to the stamp ST. Thus, a first hole CE-H1 and a second hole CE-H2 may be formed in the common electrode layer CE-B. The first hole CE-H1 may be formed in the first sub-area AR1', and the second hole CE-H2 may be formed in the second sub-area AR2.

According to some example embodiments of the inventive concepts, the third area DA3 may consist of only the third sub-areas AR3 (see FIG. 7), and the second area DA2 may consist of the first sub-areas AR1' and the second sub-areas AR2. In FIG. 17B, the portion of the common electrode layer CE-B, which is located in the third sub-area AR3, may be fully removed. In FIG. 18B, the portion of the common electrode layer CE-B which is located in the second sub-area AR2 may be fully removed, but the portion of the common electrode layer CE-B which is located in the first sub-area AR1' may not be fully removed because the first sub-area AR1' provides light. Thus, a transmittance of the third area DA3 may be higher than a transmittance of the second area DA2.

If a portion of the common electrode layer CE-B is removed using a laser process, a defective rate may be increased by particles and/or shape deformation caused by heat. However, according to the embodiments of the inventive concepts, the portion of the common electrode layer CE-B may be removed using the stamp ST. In this case, shape deformation of the display panel DP by heat may be reduced or minimized, and/or particles generated in the removal process of the common electrode layer CE-B may be reduced or minimized. Thus, a defective rate caused by the process of removing the portion of the common electrode layer CE-B may be reduced.

Figure 19B:
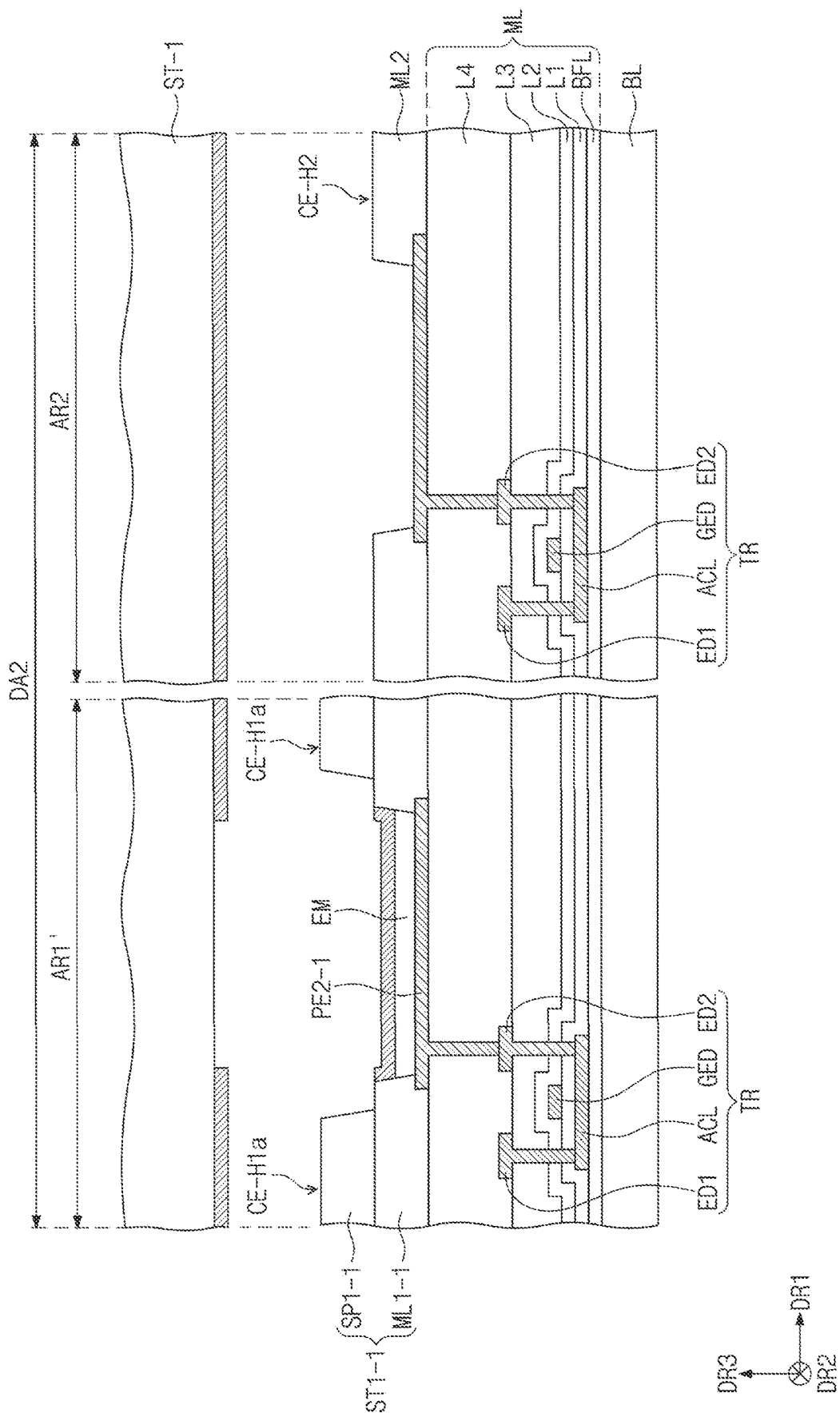

FIGS. 19A and 19B are cross-sectional views illustrating some processes of a method for manufacturing a display device according to some example embodiments of the inventive concepts.

Referring to FIGS. 19A and 19B, a first stack structure ST1-1 may be formed in an area adjacent to the second pixel electrode PE2-1. The first stack structure ST1-1 may include a first intermediate layer ML1-1 and a first spacer SP1-1. A second stack structure ST2-1 may be formed in an area adjacent to the second pixel electrode PE2-2. The first stack structure ST1-1 may include m layer(s), the second stack structure ST2-1 may include n layer(s), and 'm' may be greater than 'n'. For example, 'm' may be 2, and 'n' may be 1. Thus, the maximum thickness TK1 of the first stack structure ST1-1 may be greater than the maximum thickness TK2 of the second stack structure ST2-1.

The second stack structure ST2-1 may be the same layer as the first intermediate layer ML1-1 or may be the same layer as the first spacer SP1-1. For example, when the second stack structure ST2-1 is the same layer as the first intermediate layer ML1-1, the second stack structure ST2-1 may be formed simultaneously with the first intermediate layer ML1-1.

A common electrode layer CE-B may be formed. The common electrode layer CE-B may cover the first stack structure ST1-1, the emission layer EM, the second stack structure ST2-1, and the second pixel electrode PE2-2. According to some example embodiments, the emission layer EM may also be located between the second pixel electrode PE2-2 and the common electrode layer CE-B.

A portion of the common electrode layer CE-B may be removed using a stamping process. Thus, a transmittance of an area in which the portion of the common electrode layer CE-B is removed may be improved. A stamp ST-1 may come in contact with portions of the common electrode layer CE-B, which correspond to the second area DA2.

According to some example embodiments, the common electrode layer CE-B located in the second sub-area AR2 may be fully removed. The common electrode layer CE-B located in the second sub-area AR2 may have a stepped top surface. Thus, a hardness of the stamp ST-1 may be lower than that of the stamp ST illustrated in FIG. 18A. Therefore, a shape of the stamp ST-1 may be easily deformed by pressure. The stamp ST-1 of which the shape is deformed is illustrated in FIG. 19A. The entire portion of the common electrode layer CE-B located in the second sub-area AR2 may be in contact with the stamp ST-1.

The portions of the common electrode layer CE-B, which are in contact with the stamp ST-1, may be adhered to the stamp ST-1. Thus, a first hole CE-H1a and a second hole CE-H2 may be formed in the common electrode layer CE-B. The first hole CE-H1a may be formed in the first sub-area AR1', and the second hole CE-H2 may be formed in the second sub-area AR2.

According to the aforementioned embodiments of the inventive concepts, a portion of the common electrode may be removed using the stamping process, and thus a defective rate in the manufacturing process may be reduced.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A display device comprising:
    a display panel including:
    a first area having a first resolution; and
    a second area having a second resolution lower than the first resolution, wherein the display panel comprises:
a base layer;
a circuit layer on the base layer;
a first pixel electrode electrically connected to the circuit layer and in the first area;
a second pixel electrode electrically connected to the circuit layer and in the second area;
a first stack structure on the circuit layer and adjacent to the first pixel electrode; and
a second stack structure on the circuit layer and adjacent to the second pixel electrode, the second stack structure being different from the first stack structure.

2. The display device of claim 1, wherein the first stack structure comprises:
a first intermediate layer on the circuit layer and exposing at least a portion of the first pixel electrode; and
a first spacer on the first intermediate layer, an area of the first spacer being less than an area of the first intermediate layer in a plan view.

3. The display device of claim 2, wherein the second stack structure comprises:
a second intermediate layer on the circuit layer and covering the second pixel electrode; and
a second spacer on the second intermediate layer.

4. The display device of claim 3, wherein an area of the second intermediate layer is equal to an area of the second spacer in a plan view.

5. The display device of claim 3, wherein the first intermediate layer and the second intermediate layer comprise a same material and are at a same layer.

6. The display device of claim 2, wherein a first maximum thickness of the first stack structure is greater than a second maximum thickness of the second stack structure.

7. The display device of claim 6, wherein the second stack structure comprises a second intermediate layer at a same layer as the first intermediate layer.

8. The display device of claim 2, wherein the display panel further includes a third area having a third resolution lower than the first resolution of the first area, the display device further comprising:
a first module under the second area; and
a second module under the third area,
wherein the display panel further comprises: a third pixel electrode electrically connected to the circuit layer and in the third area.

9. The display device of claim 8, wherein the first intermediate layer and the first spacer are not in the third area.

10. The display device of claim 8, wherein the third resolution of the third area is lower than the second resolution of the second area.

11. The display device of claim 1, wherein the first stack structure comprises one or more first layers,
wherein the second stack structure comprises one or more second layers, and
wherein a number of the one or more first layers is greater than a number of the one or more second layers.

12. The display device of claim 1, wherein the display panel further comprises a common electrode including a first hole and a second hole.

13. The display device of claim 12, wherein the first hole and the second hole are in the second area.

14. The display device of claim 12, wherein the second area includes a first sub-area configured to provide light and a second sub-area not configured to provide light, the first hole is in the first sub-area, and the second hole is in the second sub-area.

15. The display device of claim 14, wherein the second pixel electrode is in the second sub-area.

16. The display device of claim 14, wherein the display panel further comprises:
a fourth pixel electrode in the first sub-area; and
a third stack structure on the circuit layer and adjacent to the fourth pixel electrode, the third stack structure having a same structure as the first stack structure.

17. The display device of claim 16, wherein the third stack structure comprises:
an intermediate layer exposing at least a portion of the fourth pixel electrode; and
a spacer on the intermediate layer,
wherein the first hole is defined on the spacer.

18. The display device of claim 1, further comprising a module under the second area.

19. A display device comprising:
a display panel including:
a first area having a first resolution; and
a second area having a second resolution lower than the first resolution,
wherein the display panel comprises:
a base layer;
a circuit layer on the base layer;
a first stack structure on the circuit layer and in the first area; and
a second stack structure on the circuit layer and in the second area, the second stack structure being different from the first stack structure,
wherein the display panel further comprises a common electrode including a hole overlapping the second stack structure.

* * * * *